(12) United States Patent
Wang et al.

(10) Patent No.: US 11,538,823 B2
(45) Date of Patent: Dec. 27, 2022

(54) DYNAMIC RANDOM ACCESS MEMORY DEVICE AND METHOD OF FABRICATING THE SAME

(71) Applicants: Chen-Chih Wang, Taipei (TW); Li-Wei Ho, Taipei (TW)

(72) Inventors: Chen-Chih Wang, Taipei (TW); Li-Wei Ho, Taipei (TW)

( * ) Notice: Subject to any disclaimer, the term of this patent is extended or adjusted under 35 U.S.C. 154(b) by 239 days.

(21) Appl. No.: 16/806,381

(22) Filed: Mar. 2, 2020

(65) Prior Publication Data

US 2020/0343246 A1 Oct. 29, 2020

Related U.S. Application Data

(60) Provisional application No. 62/837,890, filed on Apr. 24, 2019.

(51) Int. Cl.
*H01L 27/11582* (2017.01)
*H01L 27/11556* (2017.01)
(Continued)

(52) U.S. Cl.
CPC ...... *H01L 27/11582* (2013.01); *H01L 23/528* (2013.01); *H01L 27/1085* (2013.01); *H01L 27/10805* (2013.01); *H01L 27/10808* (2013.01); *H01L 27/10814* (2013.01); *H01L 27/10873* (2013.01); *H01L 27/10882* (2013.01); *H01L 27/11519* (2013.01); *H01L 27/11556* (2013.01);
(Continued)

(58) Field of Classification Search
CPC ......... H01L 27/10814; H01L 27/11582; H01L 27/11556; H01L 29/7827; H01L 29/7926
See application file for complete search history.

(56) References Cited

U.S. PATENT DOCUMENTS 10,388,658 B1 * 8/2019 Ramaswamy .... H01L 27/10891
2018/0069117 A1 * 3/2018 Cho ................. H01L 27/10876
(Continued)

*Primary Examiner* — Aaron J Gray
(74) *Attorney, Agent, or Firm* — Muncy, Geissler, Olds & Lowe, P.C.

(57) ABSTRACT

The invention discloses a dynamic random access memory (DRAM) device and a method of fabricating such DRAM device. The DRAM device according to the invention includes a plurality of bit lines formed on a semiconductor substrate, a plurality of first isolation stripes, a plurality of second isolation stripes, a plurality of transistors formed between the first isolation stripes and the second isolation stripes, a plurality of word lines, and a plurality of capacitors formed above the first isolation stripes and the second isolation stripes. The semiconductor substrate defines a longitudinal direction, a transverse direction, a normal direction, a plurality of columns in the longitudinal direction, and a plurality of rows in the transverse direction. The first isolation stripes and the second isolation stripes extend in the longitudinal direction. Each transistor corresponds to one of the columns and one of the rows. The transistors on one side of each first isolation stripe and the transistors on the other side of said one first isolation stripe are staggeredly arranged. Each word line corresponds to one of the columns and connects the gate conductors of the transistors along the corresponding column. Each capacitor corresponds to one of the transistors and connects the source region of the corresponding transistor.

5 Claims, 24 Drawing Sheets

(51) Int. Cl.
    *H01L 27/11519*    (2017.01)
    *H01L 27/11565*    (2017.01)
    *H01L 27/108*    (2006.01)
    *H01L 23/528*    (2006.01)
    *H01L 21/28*    (2006.01)
    *H01L 29/78*    (2006.01)
    *H01L 29/792*    (2006.01)
    *H01L 23/522*    (2006.01)
    *H01L 21/02*    (2006.01)
    *H01L 21/762*    (2006.01)
    *H01L 21/3213*    (2006.01)
    *H01L 21/768*    (2006.01)
    *G11C 11/408*    (2006.01)

(52) U.S. Cl.
    CPC .. *H01L 27/11565* (2013.01); *H01L 29/40114* (2019.08); *H01L 29/40117* (2019.08); *H01L 29/7827* (2013.01); *H01L 29/7926* (2013.01); *G11C 11/4087* (2013.01); *H01L 21/02532* (2013.01); *H01L 21/02595* (2013.01); *H01L 21/32133* (2013.01); *H01L 21/76224* (2013.01); *H01L 21/76802* (2013.01); *H01L 21/76877* (2013.01); *H01L 23/5226* (2013.01); *H01L 27/10829* (2013.01); *H01L 27/10861* (2013.01)

(56) References Cited

U.S. PATENT DOCUMENTS

2019/0123060 A1    4/2019   Wang
2020/0303380 A1*  9/2020   Wang ................ H01L 27/10852

* cited by examiner

DYNAMIC RANDOM ACCESS MEMORY DEVICE AND METHOD OF FABRICATING THE SAME

CROSS-REFERENCE TO RELATED APPLICATION

This utility application claims priorities to U.S. Provisional Application Ser. No. 62/837,890, filed Apr. 24, 2019, which is incorporated herein by reference.

BACKGROUND OF THE INVENTION

1. Field of the Invention

The invention relates to a dynamic random access memory (DRAM) device and a method of fabricating the same, and more in particular, to a DRAM device including a plurality of vertical current type fan-shaped field effect transistors and a method of fabricating such memory device.

2. Description of the Prior Art

Referring to FIG. 1 and FIG. 2, those drawings schematically illustrate a vertical current type fan-shaped field effect transistor (FanFET) 1 disclosed by US patent publication no. 20190123060A1. FIG. 1 is a perspective view of the vertical current type FanFET 1. FIG. 2 is a cross-sectional schematic drawing of the vertical current type FanFET 1 taken along the A-A line of FIG. 1.

As shown in FIG. 1 and FIG. 2, the vertical current type FanFET 1 includes a pillar 10 of a semiconductor material, extending in a transverse direction T of a semiconductor substrate (not shown in FIGS. 1 and 2), a gate dielectric layer 12 and a gate conductor 14. The semiconductor substrate also defines a normal direction N and a longitudinal direction L as shown in FIG. 1.

The pillar 10 of a semiconductor material has a base side face 100 perpendicular to the transverse direction T, a tapered side face 101 opposite to the base side face 100, a top face 102 parallel to the transverse direction T, a bottom face 103 opposite to the top face 102, a front side face 104 adjacent to the base side face 100 and the tapered side face 101, and a rear side face 105 opposite to the front side face 104. A first elongated portion 106, sandwiched among the base side face 100, the front side face 104, the top face 102 and the rear side face 105, forms a source region. A second elongated portion 107, sandwiched among the base side face 100, the front side face 104, the rear side face 105 and the bottom face 103, forms a drain region. A plate portion 108 on the base side face 100 and between the first elongated portion 106 and the second elongated portion 107 forms a channel region. Other portion of the pillar 10 forms a body region. The gate dielectric layer 12 is formed to overlay the base side face 100 of the pillar 10 of the semiconductor material. The gate conductor 14 is formed to overlay the gate dielectric layer 12.

Obviously, in the vertical current type FanFET 1, the pillar 10 of the semiconductor material extends in the transverse direction T of the semiconductor substrate, and the first elongated portion 106 of the source region and the second elongated portion 107 of the drain region are oppositely arranged up and down in the pillar 10 of the semiconductor material.

To achieve a smaller size, DRAM devices of the prior arts utilize various vertical transistors. In this manner, the DRAM devices may have cell sizes of $4F^2$ by using such vertical transistors stacked either below or above the cell capacitors, where F represents a process feature size (i.e., the minimum lithographic feature size). However, the cell sizes of $4F^2$ are already the limit of DRAM devices of these prior arts.

SUMMARY OF THE INVENTION

Accordingly, one scope of the invention is to provide a DRAM device including such vertical current type fan-shaped field effect transistors and a method of fabricating such memory device. In particular, the DRAM device according to the may have a cell size of less than $4F^2$.

A DRAM device according to a preferred embodiment of the invention includes a semiconductor substrate, a plurality of bit lines, a plurality of first isolation stripes, a plurality of second isolation stripes, a plurality of multi-layer stripes, a plurality of transistors, a plurality of word lines, a second insulating layer, a plurality of landing via contacts, a third insulating layer, and a plurality of capacitors. The semiconductor substrate defines a longitudinal direction, a transverse direction, a normal direction, a plurality of columns in the longitudinal direction, and a plurality of rows in the transverse direction. The plurality of bit lines are formed on the semiconductor substrate. Each bit line corresponds to one of the rows, and extends along the corresponding row. The plurality of first isolation stripes are formed on the bit lines, and extend in the longitudinal direction. Each first isolation stripe has a respective first longitudinal edge and a respective second longitudinal edge. The plurality of second isolation stripes are formed on the bit lines, and extends in the longitudinal direction. Each second isolation stripe has a respective third longitudinal edge and a respective fourth longitudinal edge. The first isolation stripes and the second isolation stripes are alternatingly arranged. Each of the plurality of multi-layer stripes is constituted by a first semiconductor layer formed on the bit lines, a second semiconductor layer and a plurality of recesses formed between the first semiconductor layer and the second semiconductor layer. Each multi-layer stripe corresponds to one of the first isolation stripes and one of the second isolation stripes. Each multi-layer stripe is located between the corresponding first isolation stripe and the corresponding second isolation stripe. The plurality of recesses of each multi-layer stripe face the third longitudinal edge or the fourth longitudinal edge of the corresponding second isolation stripe. The recesses at one side of each first isolation stripe and the recesses at the other side of said one first isolation stripe are staggeredly arranged. Each recess corresponds to one of the columns and one of the rows. Each transistor corresponds to one of the recesses, and includes a respective pillar of a semiconductor material. Each pillar of the semiconductor material is fitted in the corresponding recess, and extends in the transverse direction. Each pillar of the semiconductor material has a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face. Each pillar of the semiconductor material also has a respective first elongated portion sandwiched among the first top face, the base side face, the front side face and the rear side face forming a respective source region. Each pillar of the semiconductor material also has a respective second elongated portion sandwiched among the bottom face, the base side face, the front side face and the rear side face forming a respective drain region. Each pillar of the semiconductor material also has a respective plate portion on the base side face and between the first elongated portion, the second elongated portion forming a respective channel region, and other portion of the pillar forming a respective body region. Each transistor also includes a respective gate oxide/dielectric layer overlaying the base side face of the corresponding pillar of the semiconductor material, a respective gate conductor overlaying the gate oxide/dielectric layer, a respective first sub-bit line being formed at the first semiconductor layer and connecting between the drain region and the bit line corresponding to said one transistor, and a respective second sub-bit line being formed at the second semiconductor layer and connecting the source region. Each word line corresponds to one of the columns and connects the gate conductors along the corresponding column. The second insulating layer is formed on the second semiconductor layer, the first isolation stripes and the second isolation stripes. Each landing via contact corresponds to one of the second sub-bit lines, and is formed through the second insulating layer to connect the corresponding second sub-bit line. The third insulating layer is formed on the second insulating and the landing via contacts. Each capacitor corresponds to one of the landing via contacts, and is formed through the third insulating layer to connect the corresponding landing via contact.

In one embodiment, the base side face can be planar, convex or concave.

In one embodiment, in each transistor, a combination of the first top face of the pillar of the semiconductor material, a second top face of the gate oxide/dielectric layer and a third top face of the gate conductor can exhibit a semi-ellipse, a semi-circle, a triangle, a finger-like shape or a trapezoid.

On theory, a cell size of the DRAM device according to the invention is equal to 3.5 times a square of a process feature size.

Further, the DRAM device according to the invention also includes a fourth insulating layer and a plurality of connection lines. The fourth insulating layer is faulted to overlay the semiconductor substrate and the bit lines. Each connection line corresponds to one of the first sub-bit lines and one of the bit lines, and is formed through the fourth insulating layer to connect between the corresponding first sub-bit line and the corresponding bit line.

A method, according to a preferred embodiment of the invention, of fabrication a DRAM device, firstly, is to form a plurality of bit lines on a semiconductor substrate, where the semiconductor substrate defines a longitudinal direction, a transverse direction, a normal direction, a plurality of columns in the longitudinal direction, and a plurality of rows in the transverse direction. Each bit line corresponds to one of the rows, and extends along the corresponding row. Next, the method according to the invention is to form a first semiconductor layer on the bit lines. Then, the method according to the invention is to form a first insulating layer on the first semiconductor layer. Subsequently, the method according to the invention is to form a second semiconductor layer on the first insulating layer. Afterward, the method according to the invention is to form a plurality of first trenches parallel to the longitudinal direction and through the first semiconductor layer, the first insulating layer and the second semiconductor layer, where each first trench has a respective first longitudinal side wall, a respective second longitudinal side wall and a plurality of protrusions protruding inwardly. The protrusions on the first longitudinal side wall and the protrusions on the second longitudinal side wall are staggeredly arranged. Next, the method according to the invention is to form a plurality of first isolation stripes which each is filled in one of the first trenches such that a plurality of multi-layer stripes of the first semiconductor layer, the first insulating layer and the second semiconductor layer and the first isolation stripes are alternately arranged. Then, the method according to the invention is to form a plurality of second trenches parallel to the longitudinal direction, where each second trench is formed on a portion of one of the multi-layer stripes and through the first semiconductor layer, the first insulating layer and the second semiconductor layer, and has a respective third longitudinal side wall and a respective fourth longitudinal side wall. Subsequently, the method according to the invention is to partially dope the first semiconductor layer and the second semiconductor layer on the third longitudinal side wall and the fourth longitudinal side wall of each second trench to form a plurality of first conductive portions on the first semiconductor layer and a plurality of second conductive portions on the second semiconductor layer, where each first conductive portion and each second conductive portion correspond to one of the protrusions. Afterward, the method according to the invention is to remove a plurality of retained portions of the first insulating layer which each corresponds to one of the protrusions such that a plurality of recesses are formed on the third longitudinal side walls and the fourth longitudinal side walls of the second trenches, where the recesses at one side of each first isolation stripe and the recesses at the other side of said one first isolation stripe are staggeredly arranged. Each recess corresponds to one of the columns and one of the rows. Next, the method according to the invention is to form a plurality of pillars of a semiconductor material, where the pillars of the semiconductor material are arranged in the columns and the rows. Each pillar of the semiconductor material is fitted in one of the recesses, and has a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face. Each pillar of the semiconductor material also has a respective first elongated portion sandwiched among the first top face, the base side face, the front side face and the rear side face to form a respective source region, a respective second elongated portion sandwiched among the bottom face, the base side face, the front side face and the rear side face to form a respective drain region, a respective plate portion on the base side face and between the first elongated portion and the second elongated portion to form a respective channel region, and other portion of the pillar of the semiconductor material to form a respective body region. Each of the first conductive portions serves as one of a plurality of first sub-bit lines which each correspond to one of the pillars and connects between the drain region of the corresponding pillar and the bit line corresponding to said one pillar. Each of the second conductive portions serves as one of a plurality of second sub-bit lines which each corresponds to one of the pillars and connects the source region of the corresponding pillar. Then, the method according to the invention is to form a plurality of gate oxide/dielectric layers which each overlays the base side face of one of the pillars of the semiconductor material. Subsequently, the method according to the invention is to form a plurality of conductor layers which each overlays one of the third longitudinal side wall and the fourth longitudinal side wall of one of the second trenches. Afterward, the method according to the invention is to partially etch the conductor layers to form a plurality of gate conductors and a plurality of word lines, where each gate conductor overlays one of the gate oxide/dielectric layers, each word line conductor corresponds to one of the columns and connects the gate conductors along the corresponding column. Next, the method according to the invention is to form a plurality of second isolation stripes which each is filled in one of the second trenches. Then, the method according to the invention is to form a second insulating layer on the second semiconductor layer, the first isolation stripes and the second isolation stripes. Subsequently, the method according to the invention is to form a plurality of landing via contacts which each corresponds to one of the second sub-bit lines and is formed through the second insulating layer to connect the corresponding second sub-bit line. Finally, the method according to the invention is to form a third insulating layer on the second insulating layer and the landing via contacts. Moreover, the method according to the invention is to form a plurality of capacitors which each corresponds to one of the landing via contacts and is formed through the third insulating layer to connect the corresponding landing via contact.

Distinguishable from the prior art, the DRAM device according to the invention includes such vertical current type fan-shaped field effect transistors, and may have a cell size of less than $4F^2$.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 3:
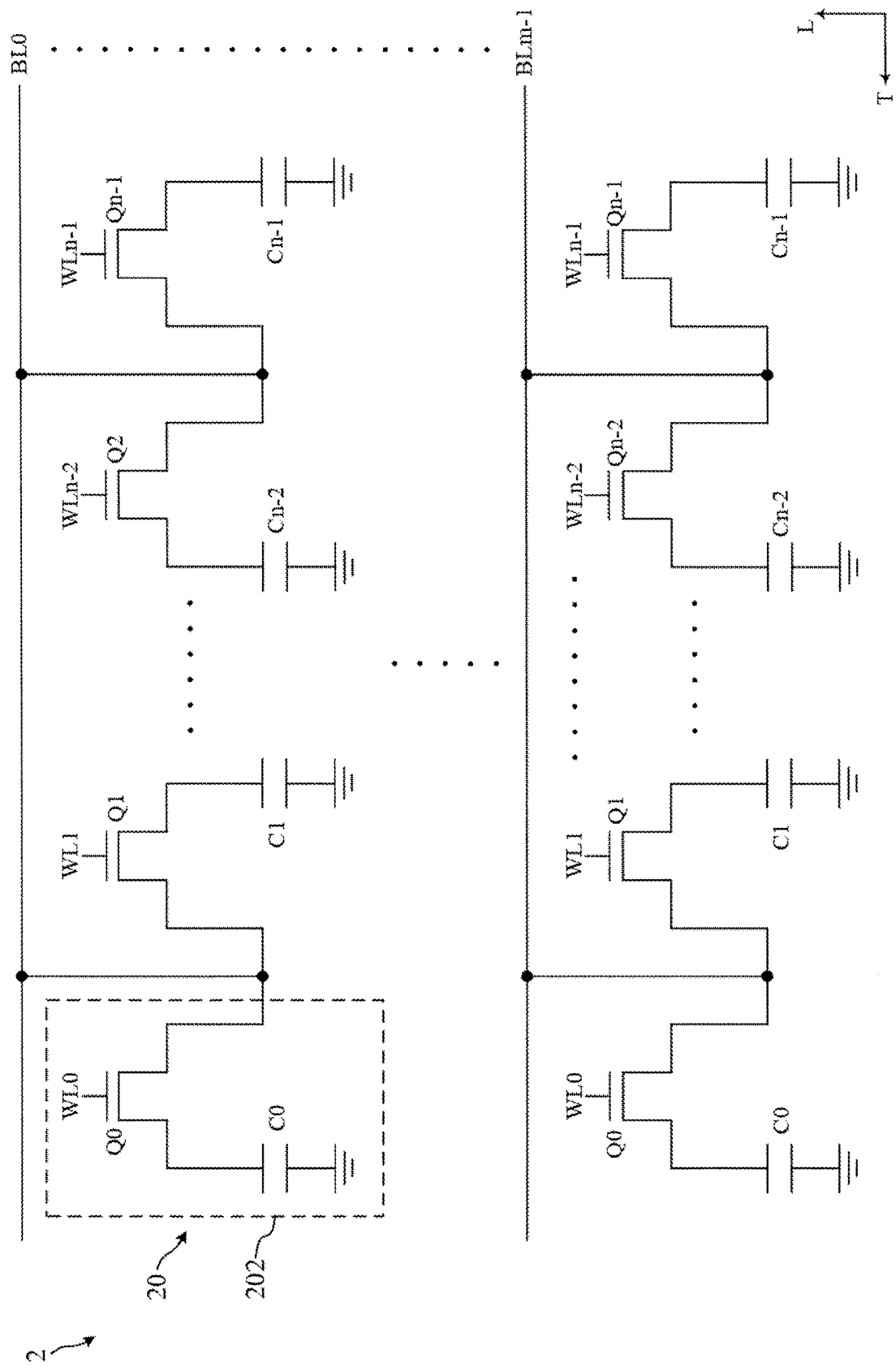
FIG. 3 is an equivalent circuit diagram of a DRAM device according to a preferred embodiment of the invention.

Referring to FIG. 3, FIG. 3 is an equivalent circuit diagram of a DRAM device 2 according to a preferred embodiment of the invention. In greater detail, FIG. 3 is an equivalent circuit diagram of the DRAM device 2 having a vertical channel structure.

As shown in FIG. 3, a memory cell array in the DRAM device 2 according to the invention includes a plurality of memory cell strings 20 in the transverse direction T. Each of the memory cell strings 20 is constituted by a plurality of memory cell blocks 202 connected in parallel to the corresponding one of a plurality of bit lines BL0 to BLm-1. Each of the memory cell strings 20 includes the corresponding one of a plurality of bit lines BL0 to BLm-1, a plurality of transistors Q0 to Qn-1 and a plurality of capacitors C0 to Cn-1. Each of the memory cell blocks 202 is constituted by one of the transistors Q0 to Qn-1 and one of the capacitors C0 to Cn-1. Each of the transistors Q0 to Qn-1 is via a drain thereof connected to the corresponding bit line (BL0 to BLm-1), and is via a source thereof connected to one end of the corresponding capacitor (C0 to Cn-1). Each of the capacitors C0 to Cn-1 is via the other end thereof connected to a ground. Each of the word lines WL0 to WLn-1 corresponds to one of the columns, and is connected to the gates of the transistors at the same column.

Figure 1:
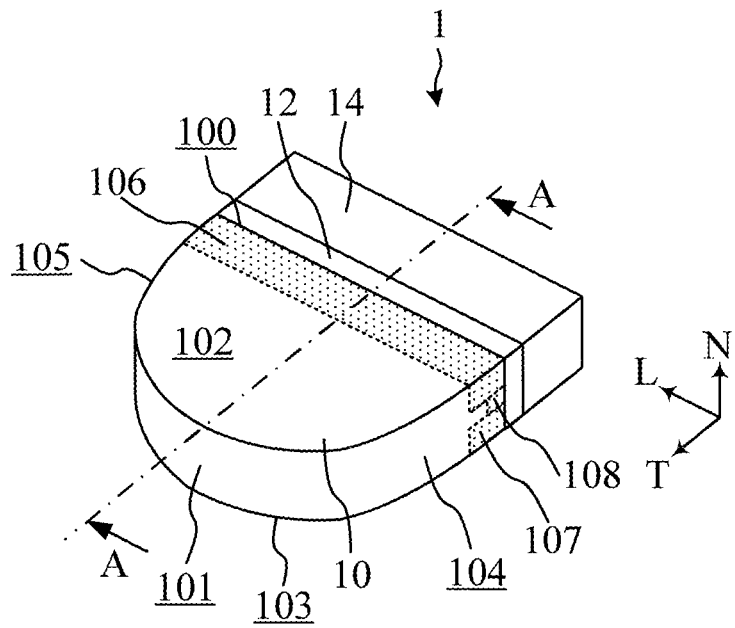
FIG. 1 is a perspective view of a vertical current type FanFET of the prior art.
Figure 2:
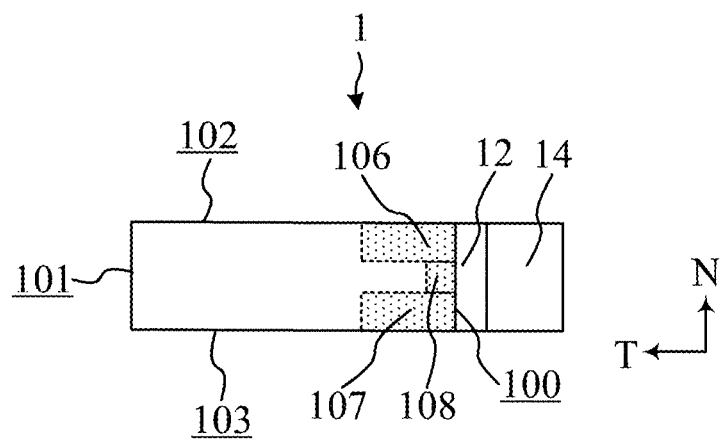
FIG. 2 is a cross-sectional view of the vertical current type FanFET taken along the A-A line of FIG. 1.
Figure 4:
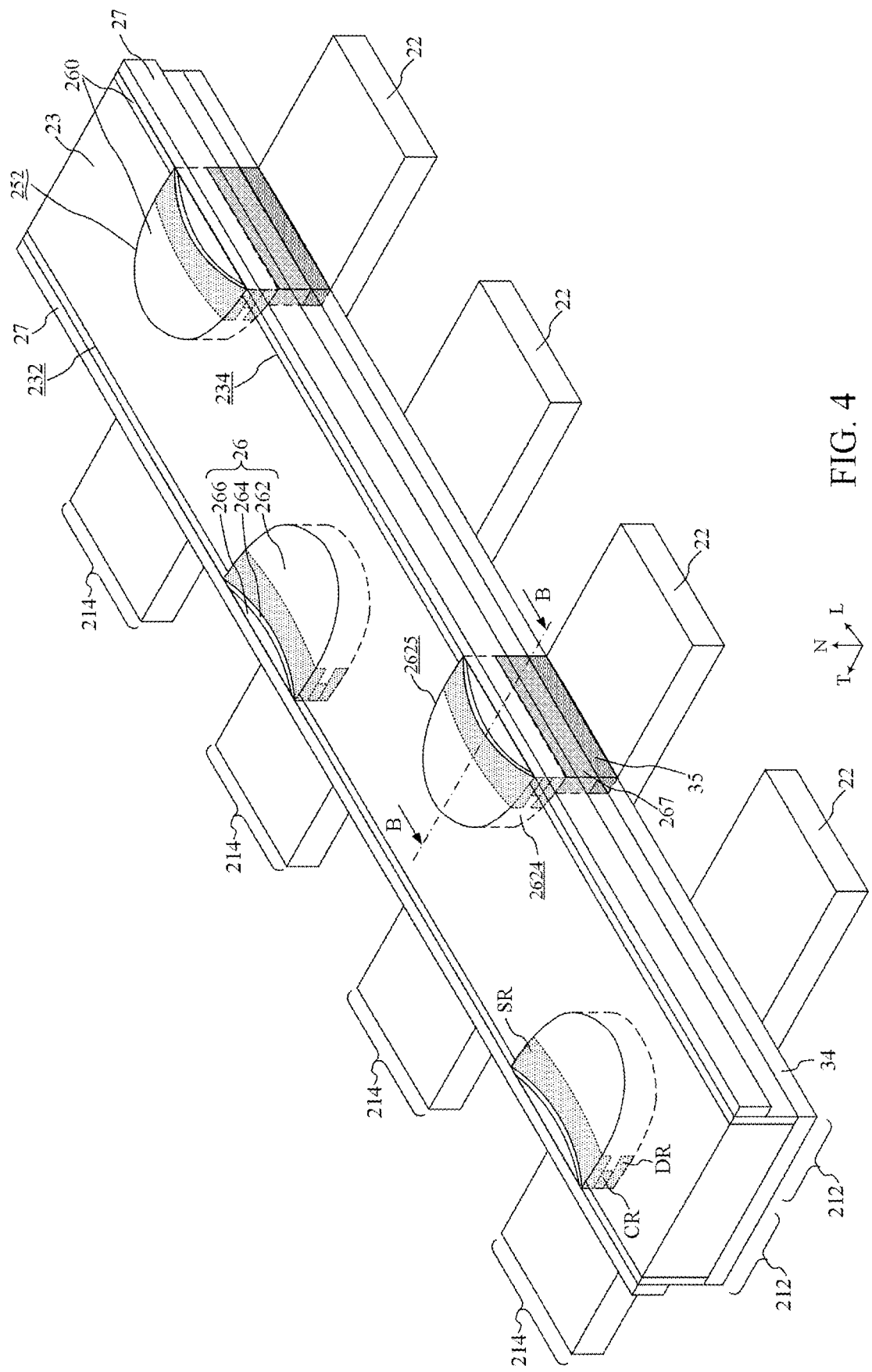
FIG. 4 is a perspective view of partial structure inside the DRAM device according to the preferred embodiment of the invention.
Figure 5:
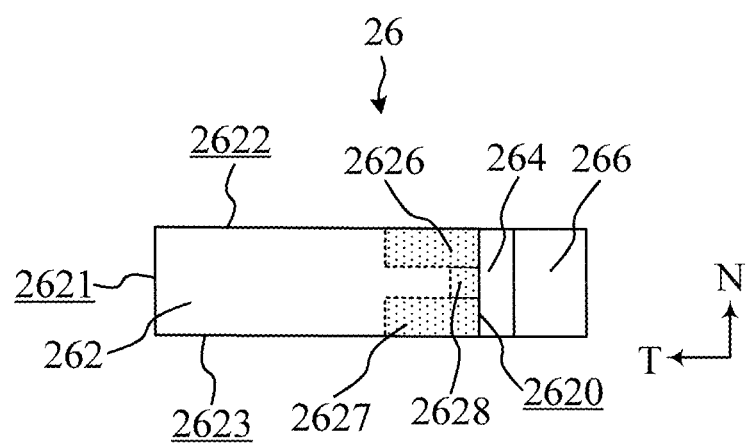
FIG. 5 is a cross-sectional view of a transistor of the DRAM device according to the invention taken along the B-B line of FIG. 4.
Figure 6:
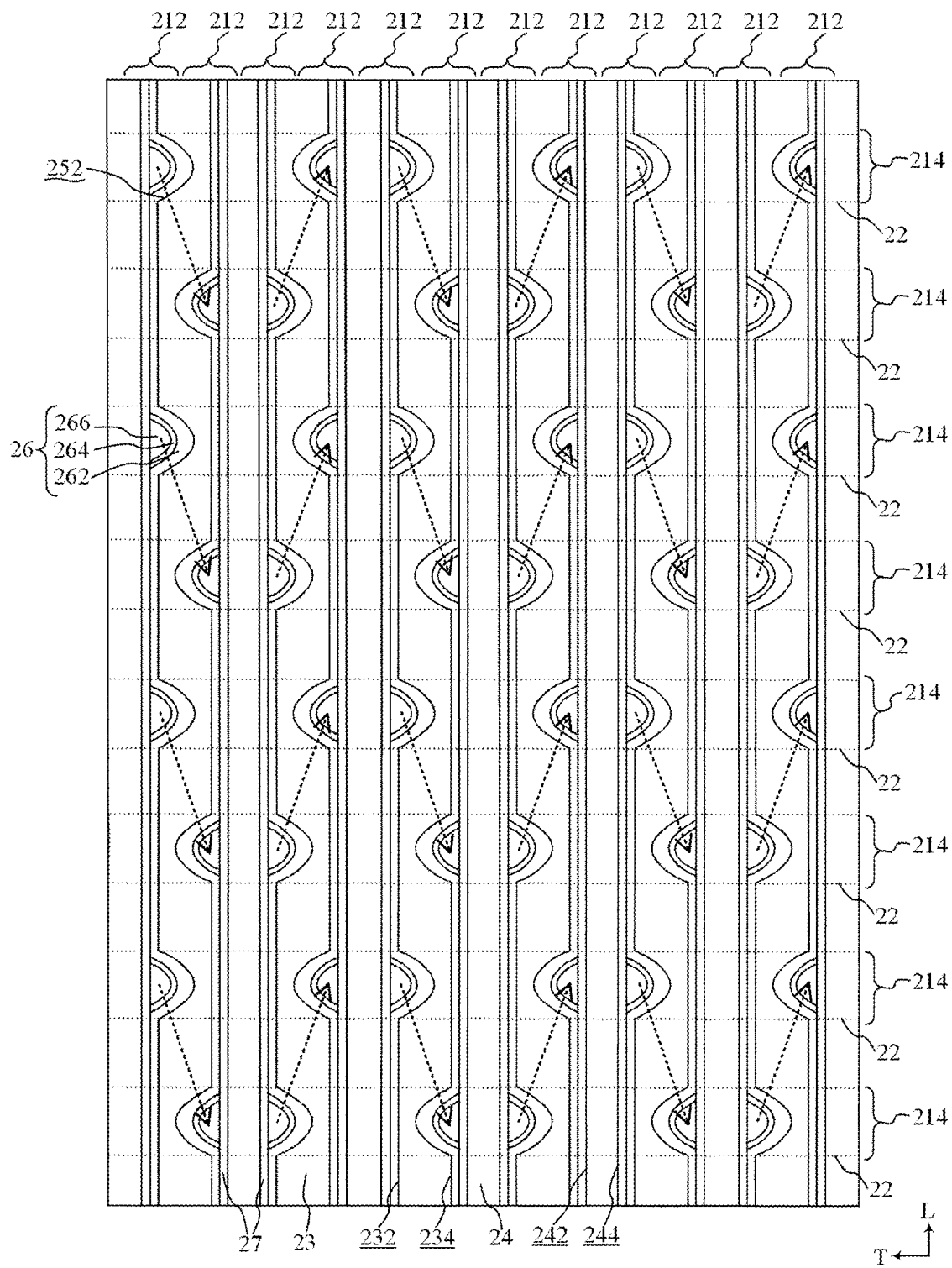
FIG. 6 is a top view of the DRAM device according to the invention and removing top structures or elements.
Figure 7:
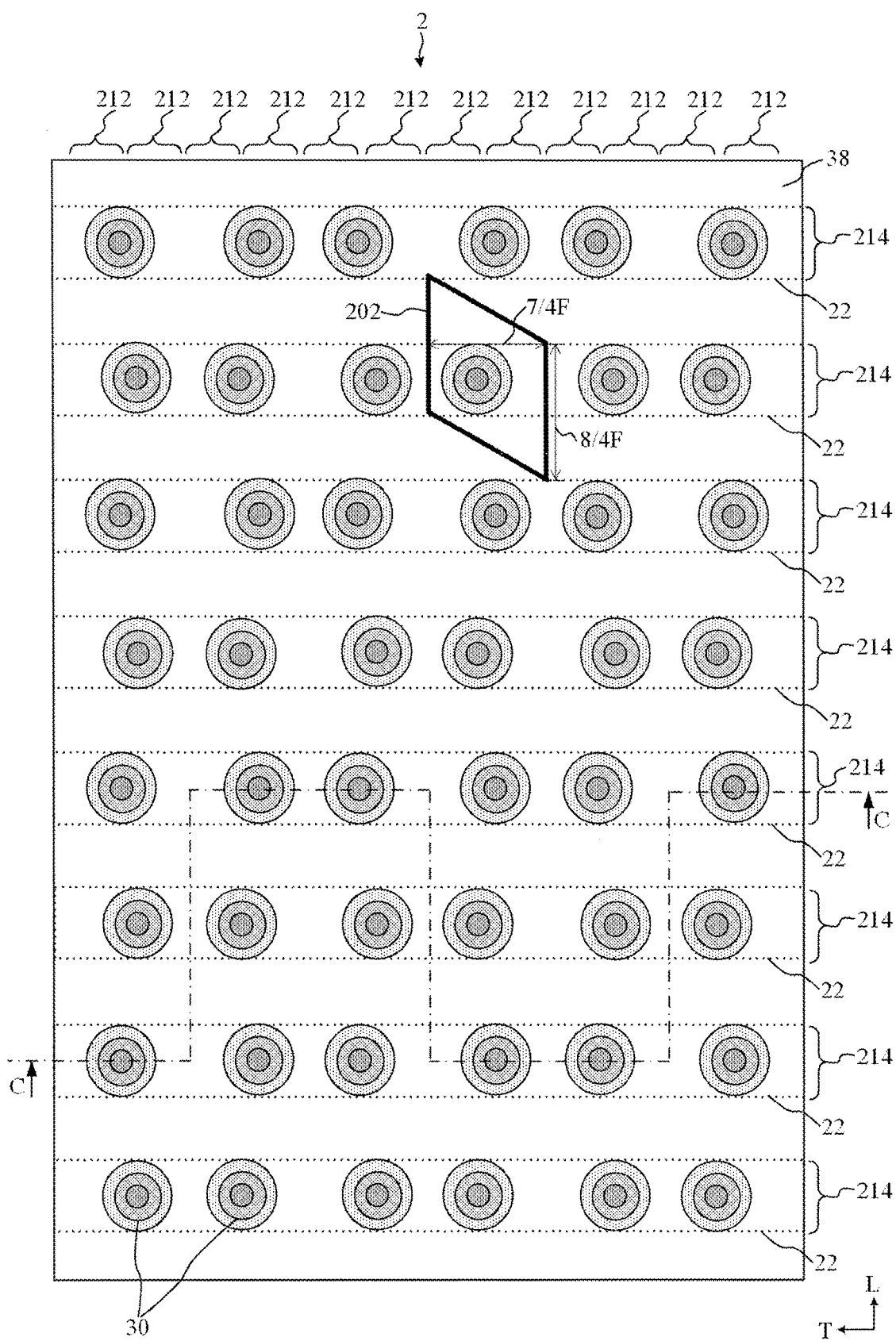
FIG. 7 is a top view of the DRAM device according to the invention.
Figure 8:
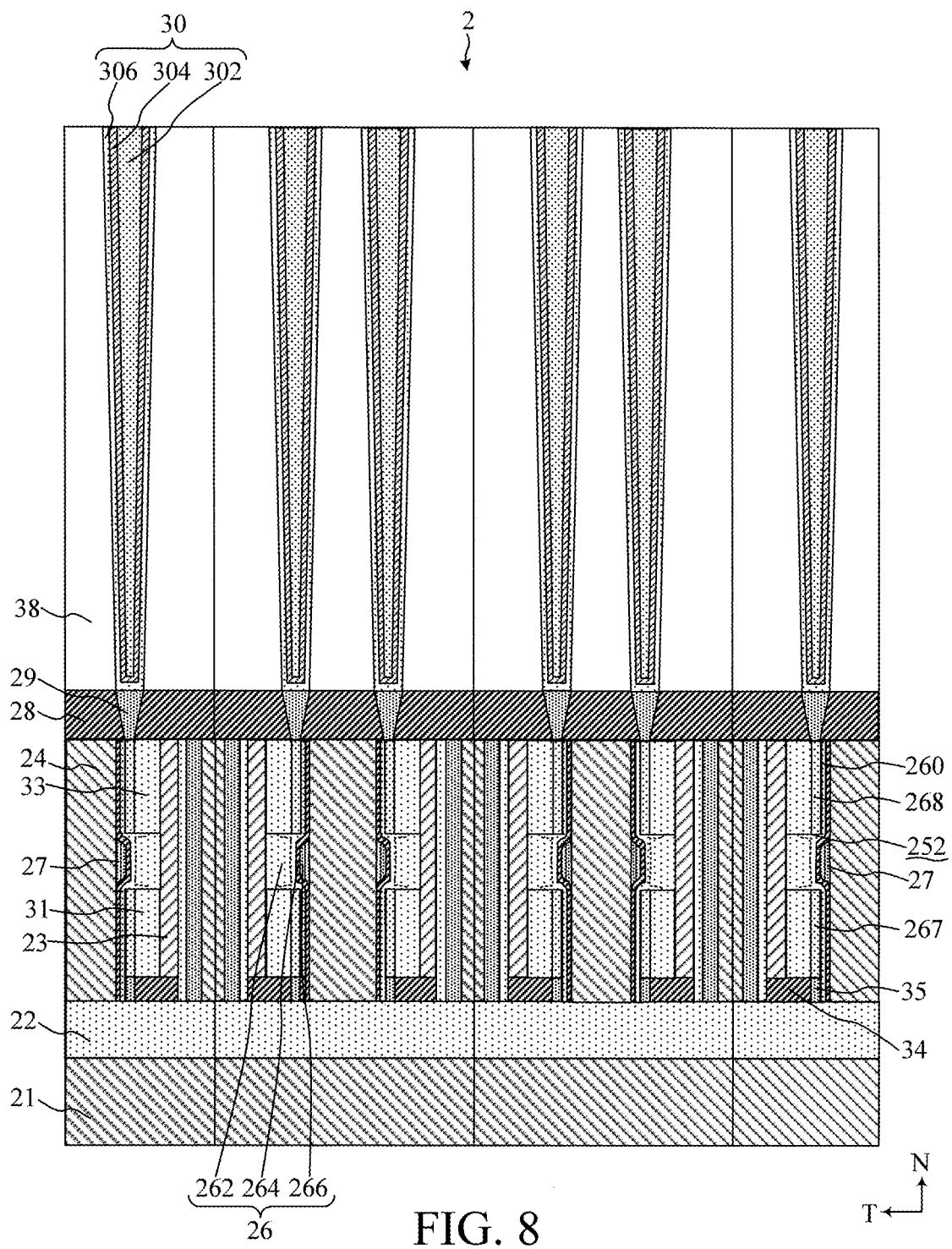
FIG. 8 is a cross-sectional schematic drawing of the DRAM device according to the invention taken along the C-C line of FIG. 7.

Referring to FIG. 4, FIG. 5, FIG. 6, FIG. 7 and FIG. 8, those drawings schematically illustrate the DRAM device 2 according to the preferred embodiment of the invention. FIG. 4 is a perspective view schematically illustrating partial structure inside the DRAM device 2 according to the preferred embodiment of the invention. FIG. 5 is a cross-sectional view of a transistor 26 of the DRAM device 2 according to the invention taken along the B-B line of FIG. 4. FIG. 6 is a top view of the DRAM device 2 according to the invention and removing top structures or elements. FIG. 7 is a top view of the DRAM device 2 according to the invention. FIG. 8 is a cross-sectional schematic drawing of the DRAM device 2 according to the invention taken along the C-C line of FIG. 7. The DRAM device 2 according to the invention is mainly constituted by a plurality of transistors like that as shown in FIG. 1 and FIG. 2. Moreover, referring to FIG. 14, FIG. 14 is a cross-sectional schematic drawing of the semi-product of the DRAM device 2 according to the invention during fabrication.

Figure 14:
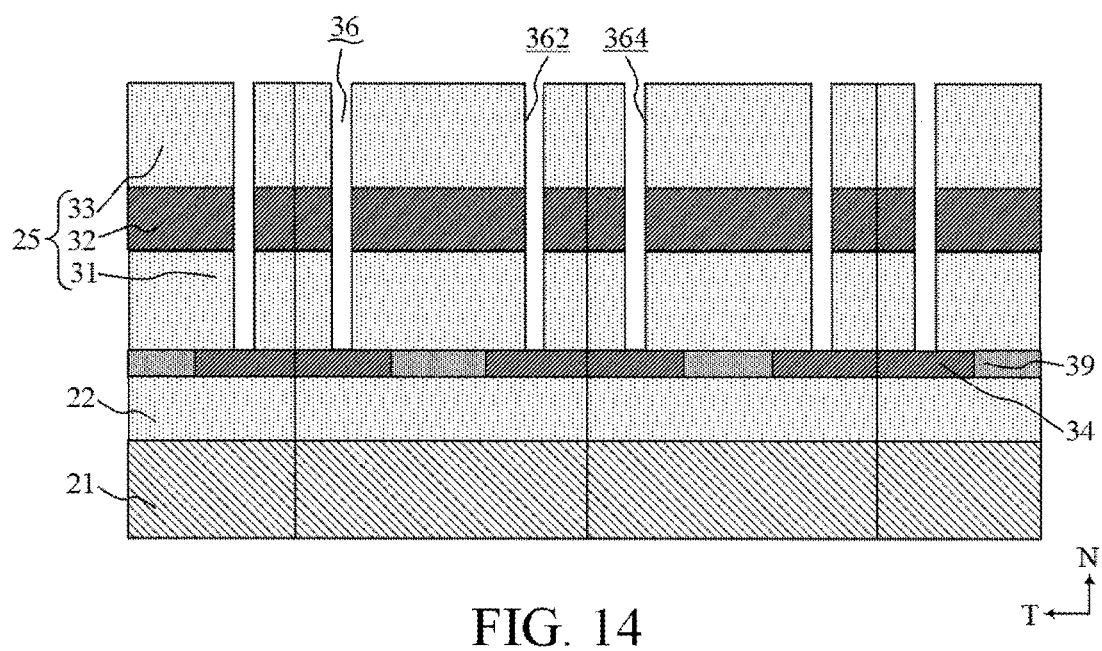
FIG. 14 is a cross-sectional schematic drawing of the semi-product of the DRAM device taken along the F-F line of FIG. 13.

As shown in FIG. 4 to FIG. 8 and FIG. 14, the DRAM device 2 according to the invention includes a semiconductor substrate 21, a plurality of bit lines 22, a plurality of first isolation stripes 23, a plurality of second isolation stripes 24, a plurality of multi-layer stripes 25 (as shown in FIG. 14), a plurality of transistors 26, a plurality of word lines 27, a second insulating layer 28, a plurality of landing via contacts 29, a third insulating layer 38, and a plurality of capacitors 30. In FIG. 6 and FIG. 7, the dotted lines represent the plurality of bit lines 22 formed below the plurality of capacitors 30 and the plurality of transistors 26.

The semiconductor substrate 21 defines a longitudinal direction L, a transverse direction T, a normal direction N, a plurality of columns 212 in the longitudinal direction L, and a plurality of rows 214 in the transverse direction T.

The plurality of bit lines 22 are formed on the semiconductor substrate 21. Each bit line 22 corresponds to one of the rows 214, and extends along the corresponding row 214.

The plurality of first isolation stripes 23 are formed on the bit lines 22, and extend in the longitudinal direction L. Each first isolation stripe 23 has a respective first longitudinal edge 232 and a respective second longitudinal edge 234. The plurality of second isolation stripes 24 are formed on the bit lines 22, and extends in the longitudinal direction L. Each second isolation stripe 24 has a respective third longitudinal edge 242 and a respective fourth longitudinal edge 244. The first isolation stripes 23 and the second isolation stripes 24 are alternatingly arranged.

Also as shown in FIG. 14, the plurality of multi-layer stripes 25 are constituted by a first semiconductor layer 31 formed on the bit lines 22, a first insulating layer 32 formed on the first semiconductor layer 31 and a second semiconductor layer 33 formed on the first insulating layer 32. It is noted that the first insulating layer 32 exists during the manufacturing of the he DRAM device 2 according to the invention, and that the first insulating layer 32 is completely removed after the DRAM device 2 according to the invention is finished.

Each multi-layer stripe 25 corresponds to one of the first isolation stripes 23 and one of the second isolation stripes 24. Each multi-layer stripe 25 is located between the corresponding first isolation stripe 23 and the corresponding second isolation stripe 24. Each multi-layer stripe 25 has a plurality of recesses 252 being formed at the first insulating layer 32 and facing the third longitudinal edge 242 or the fourth longitudinal edge 244 of the corresponding second isolation stripe 24. The recesses 252 at one side of each first isolation stripe 23 and the recesses 252 at the other side of said one first isolation stripe 23 are staggeredly arranged. Each recess 252 corresponds to one of the columns 212 and one of the rows 214.

Each transistor 26 corresponds to one of the recesses 252, and includes a respective pillar 262 of a semiconductor material 260. Each pillar 262 of the semiconductor material 260 is fitted in the corresponding recess 252, and extends in the transverse direction T. Each pillar 262 of the semiconductor material 260 has a respective base side face 2620 parallel to the normal direction N, a respective tapered side face 2621 opposite to the base side face 2620, a respective first top face 2622 perpendicular to the normal direction N, a respective bottom face 2623 opposite to the first top face 2622, a respective front side face 2624 adjacent to the base side face 2620 and the tapered side face 2621, and a respective rear side face 2625 opposite to the front side face 2624. Each pillar 262 of the semiconductor material 260 also has a respective first elongated portion 2626 sandwiched among the first top face 2622, the base side face 2620, the front side face 2624 and the rear side face 2625 forming a respective source region SR. Each pillar 262 of the semiconductor material 260 also has a respective second elongated portion 2627 sandwiched among the bottom face 2623, the base side face 2620, the front side face 2624 and the rear side face 2625 forming a respective drain region DR. Each pillar 262 of the semiconductor material 260 also has a respective plate portion 2628 on the base side face 2620 and between the first elongated portion 2626, the second elongated portion 2627 forming a respective channel region CR, and other portion of the pillar 262 forming a respective body region. In practical, the semiconductor material 260 may be also overlaid on the first longitudinal edges 232 and the second longitudinal edges 234 of the first isolation stripes 23.

In some embodiments, the semiconductor material 260 forming the pillar 262 can be, for example, polysilicon. The source region SR and the drain region DR can be doped with an n-type dopant (e.g., phosphorus or arsenic) or a p-type dopant (e.g., boron). The channel region CR can be doped with a dopant of a different conductivity from the source region SR and the drain region DR. A portion of the body region that is away from the channel region CR, the source region SR and the drain region DR can be optionally doped with the specific dopant.

Each transistor 26 also includes a respective gate oxide/dielectric layer 264 overlaying the base side face 2620 of the corresponding pillar 262 of the semiconductor material 260, a respective gate conductor 266 overlaying the gate oxide/dielectric layer 264, a respective first sub-bit line 267 being formed at the first semiconductor layer 31 and connecting between the drain region DR and the bit line 22 corresponding to said one transistor 26, and a respective second sub-bit line 268 being formed at the second semiconductor layer 33 and connecting the source region SR. Each word line 27 corresponds to one of the columns 212 and connects the gate conductors 266 along the corresponding column 212.

The second insulating layer 28 is formed on the second semiconductor layer 33, the first isolation stripes 23 and the second isolation stripes 24. Each landing via contact 29 corresponds to one of the second sub-bit lines 268, and is formed through the second insulating layer 28 to connect the corresponding second sub-bit line 268.

The third insulating layer 38 is formed on the second insulating layer 28 and the landing via contacts 29. Each capacitor 30 corresponds to one of the landing via contacts 29, and is formed through the third insulating layer 38 to connect the corresponding landing via contact 29. The capacitors 30 are separately isolated by the third insulating layer 38. The structure of the capacitors 30 can be referred to, but not be limited to, the example as shown in FIG. 8. As shown in FIG. 8, each capacitor 30 includes a respective bottom electrode 306, a respective top electrode 302, and a respective high-k dielectric layer 304 formed between the respective top electrode 302 and the respective bottom electrode 306.

In one embodiment, the base side face 2620 can be planar, convex or concave.

In one embodiment, in each transistor 26, a combination of the first top face 2622 of the pillar 262 of the semiconductor material 260, a second top face of the gate oxide/dielectric layer 264 and a third top face of the gate conductor 266 can exhibit a semi-ellipse, a semi-circle, a triangle, a finger-like shape or a trapezoid.

Further, the DRAM device 2 according to the invention also includes a fourth insulating layer 34 and a plurality of connection lines 35. The fourth insulating layer 34 is formed to overlay the semiconductor substrate 21 and the bit lines 22. Each connection line 35 corresponds to one of the first sub-bit lines 267 and one of the bit lines 22, and is formed through the fourth insulating layer 34 to connect between the corresponding first sub-bit line 267 and the corresponding bit line 22. The connection lines 35 specify stable current density and direction.

Also as shown in FIG. 7, each memory cell 202 is encircled in a bold line parallelogram with a side length of 2F where F represents the process feature size (i.e., the minimum lithographic feature size). By the bold line parallelogram, the cell size of the DRAM device 2 according to the invention is calculated by the following formula:

cell size=8/4Fx7/4F=3.5F²

Therefore, on theory, the cell size of the DRAM device 2 according to the invention is equal to 3.5 times a square of the process feature size.

Referring to FIGS. 9 through 20, those drawings schematically illustrate a method, according to a preferred embodiment of the invention, of fabrication a DRAM device 2 as shown in FIG. 4 to FIG. 8.

Figure 9:
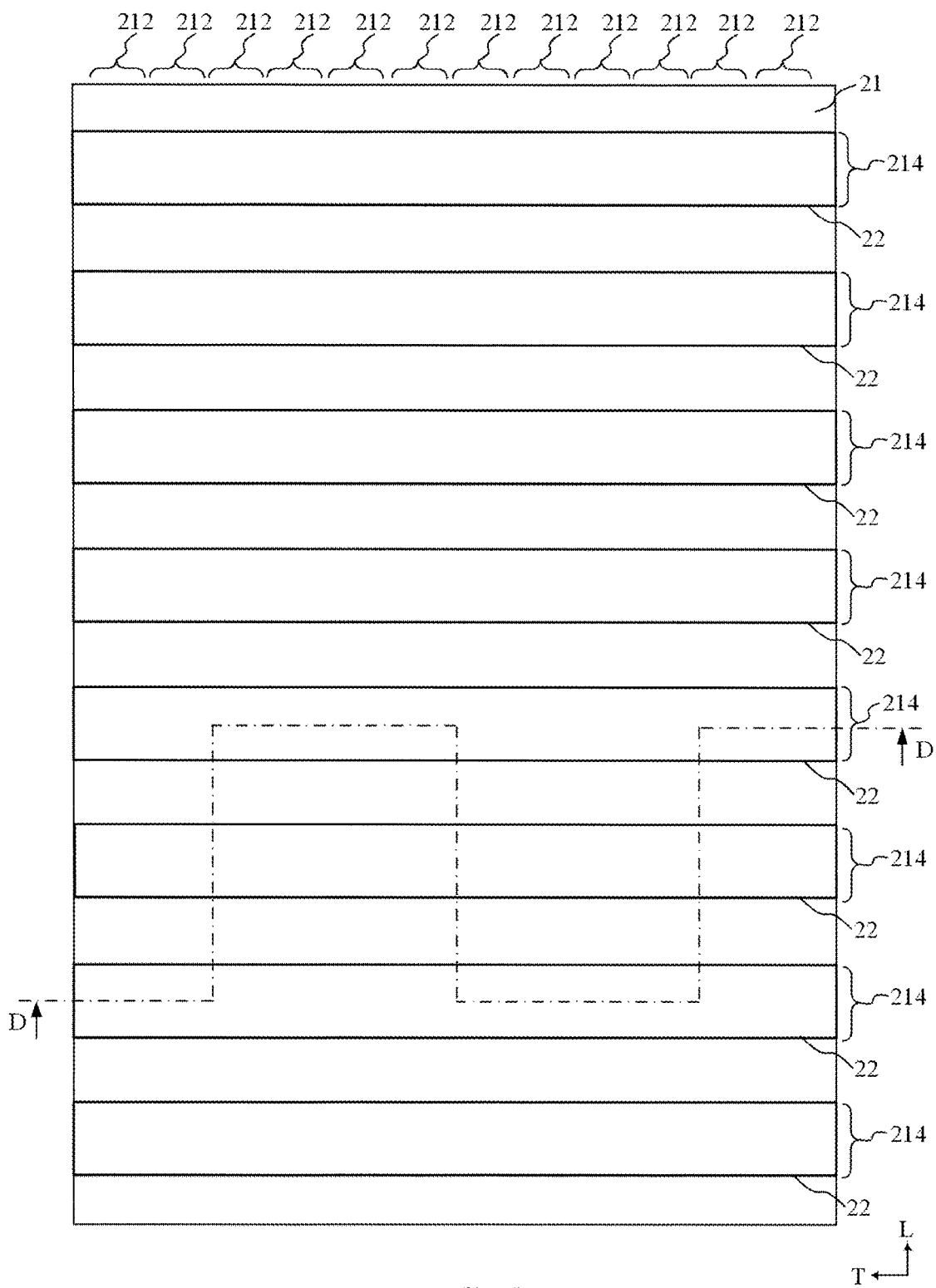
FIG. 9 is a top view of a semi-product of the DRAM device fabricated by the method according to the invention.
Figure 10:
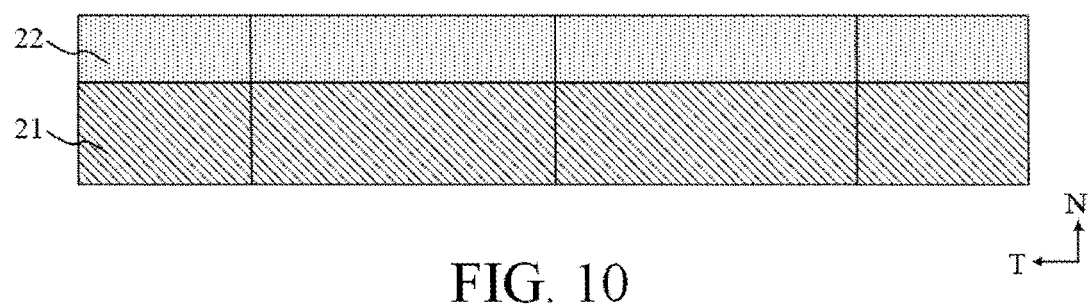
FIG. 10 is a cross-sectional schematic drawing of the semi-product of the DRAM device taken along the D-D line of FIG. 9.

Referring to FIG. 9 and FIG. 10, FIG. 9 is a top view of a semi-product of the DRAM device 2 fabricated by the method according to the invention. FIG. 10 is a cross-sectional schematic drawing of the semi-product of the DRAM device 2 taken along the D-D line of FIG. 9. As shown in FIG. 9 and FIG. 10, the method according to the invention, firstly, is to form a plurality of bit lines 22 on a semiconductor substrate 21, where the semiconductor substrate 21 defines a longitudinal direction L, a transverse direction T, a normal direction N, a plurality of columns 212 in the longitudinal direction L, and a plurality of rows 214 in the transverse direction T. Each bit line 22 corresponds to one of the rows 214, and extends along the corresponding row 214.

Figure 11:
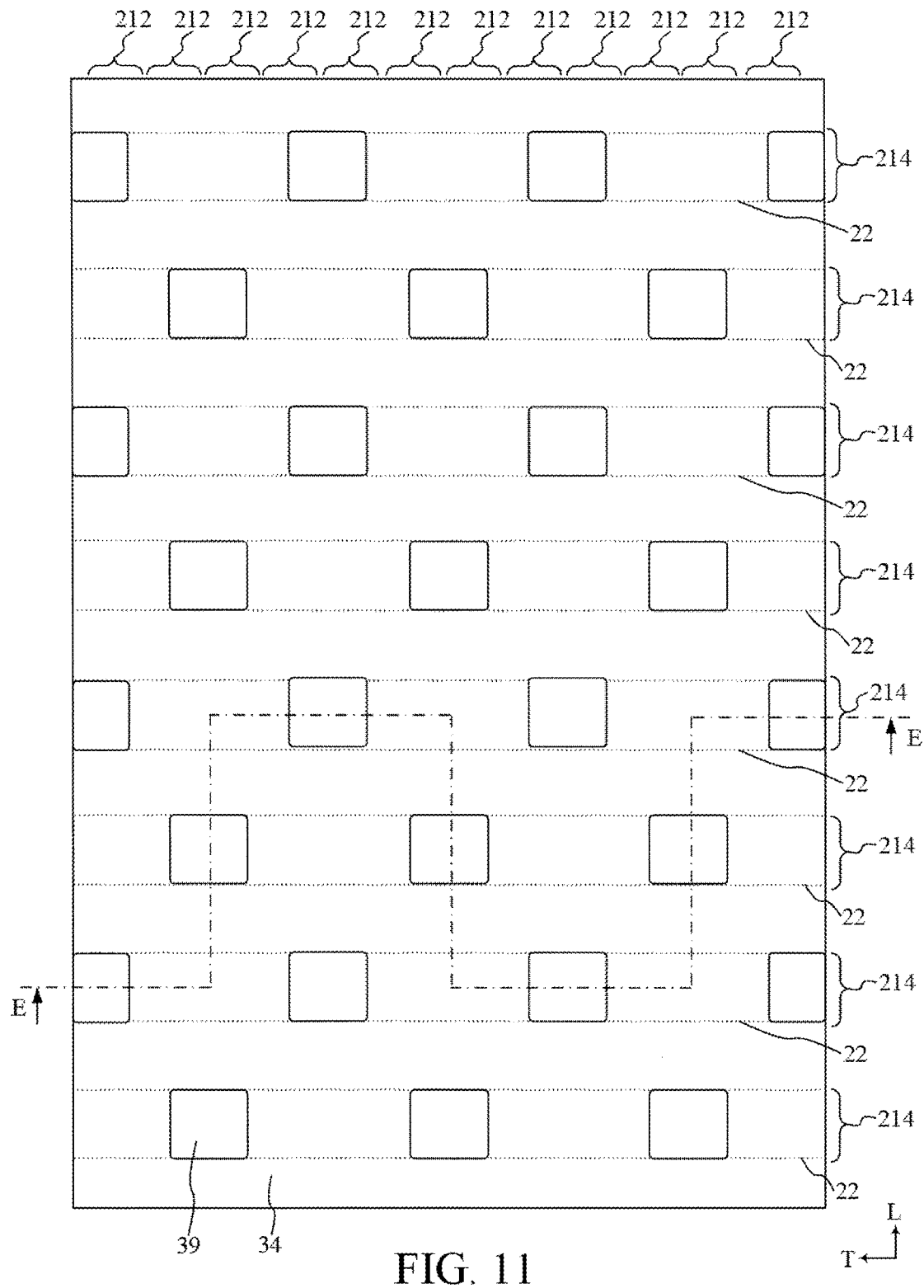
FIG. 11 is another top view of the semi-product of the DRAM device fabricated by the method according to the invention.
Figure 12:
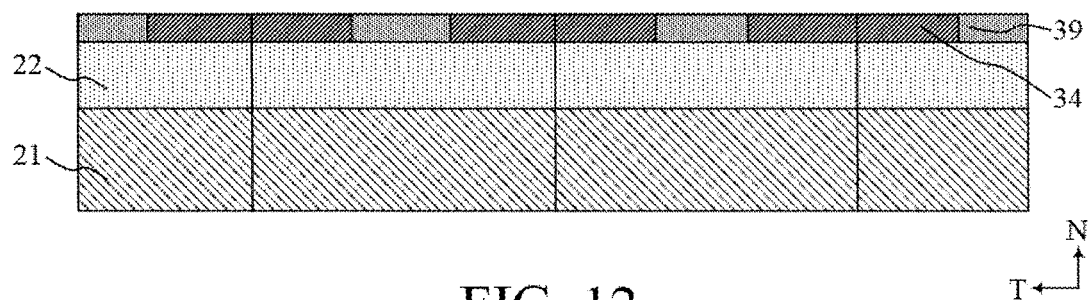
FIG. 12 is a cross-sectional schematic drawing of the semi-product of the DRAM device taken along the E-E line of FIG. 11.

Referring to FIG. 11 and FIG. 12, FIG. 11 is another top view of the semi-product of the DRAM device 2 fabricated by the method according to the invention. FIG. 12 is a cross-sectional schematic drawing of the semi-product of the DRAM device 2 taken along the E-E line of FIG. 11. As shown in FIG. 11 and FIG. 12, subsequently, the method according to the invention is to form a fourth insulating layer 34 to overlay the semiconductor substrate 21 and the bit lines 22. Also as shown in FIG. 11 and FIG. 12, next, the method according to the invention is to form a plurality of conductive pads 39 which each corresponds to one of the rows 214 and two of the columns 212 and is formed at the corresponding row 214 and the correspond two columns 212 and through the fourth insulating layer 34 to contact the bit line 22 along the corresponding row 214.

Figure 13:
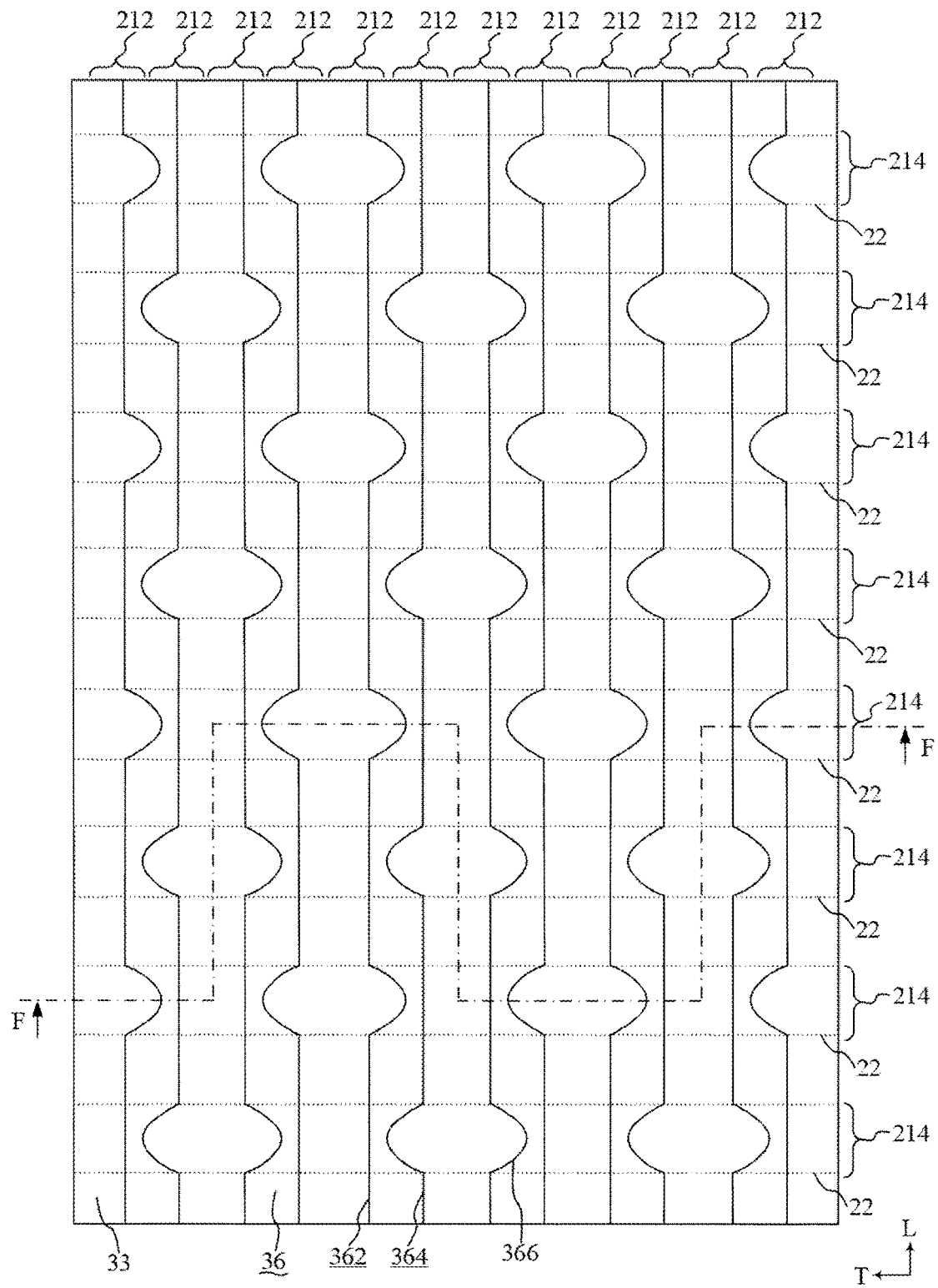
FIG. 13 is another top view of the semi-product of the DRAM device fabricated by the method according to the invention.

Referring to FIG. 13 and referring to FIG. 14 again, FIG. 13 is another top view of the semi-product of the DRAM device 2 fabricated by the method according to the invention. FIG. 14 is a cross-sectional schematic drawing of the semi-product of the DRAM device 2 taken along the F-F line of FIG. 13. As shown in FIG. 13 and FIG. 14, next, the method according to the invention is to form a first semiconductor layer 31 on the bit lines 22. Also as shown in FIG. 13 and FIG. 14, then, the method according to the invention is to form a first insulating layer 32 on the first semiconductor layer 31. Also as shown in FIG. 13 and FIG. 14, subsequently, the method according to the invention is to form a second semiconductor layer 33 on the first insulating layer 32. Also as shown in FIG. 13 and FIG. 14, afterward, the method according to the invention is to form a plurality of first trenches 36 parallel to the longitudinal direction L and through the first semiconductor layer 31, the first insulating layer 32 and the second semiconductor layer 33, where each first trench 36 has a respective first longitudinal side wall 362, a respective second longitudinal side wall 364 and a plurality of protrusions 366 protruding inwardly. The protrusions 366 on the first longitudinal side wall 362 and the protrusions 366 on the second longitudinal side wall 364 are staggeredly arranged.

Figure 15:
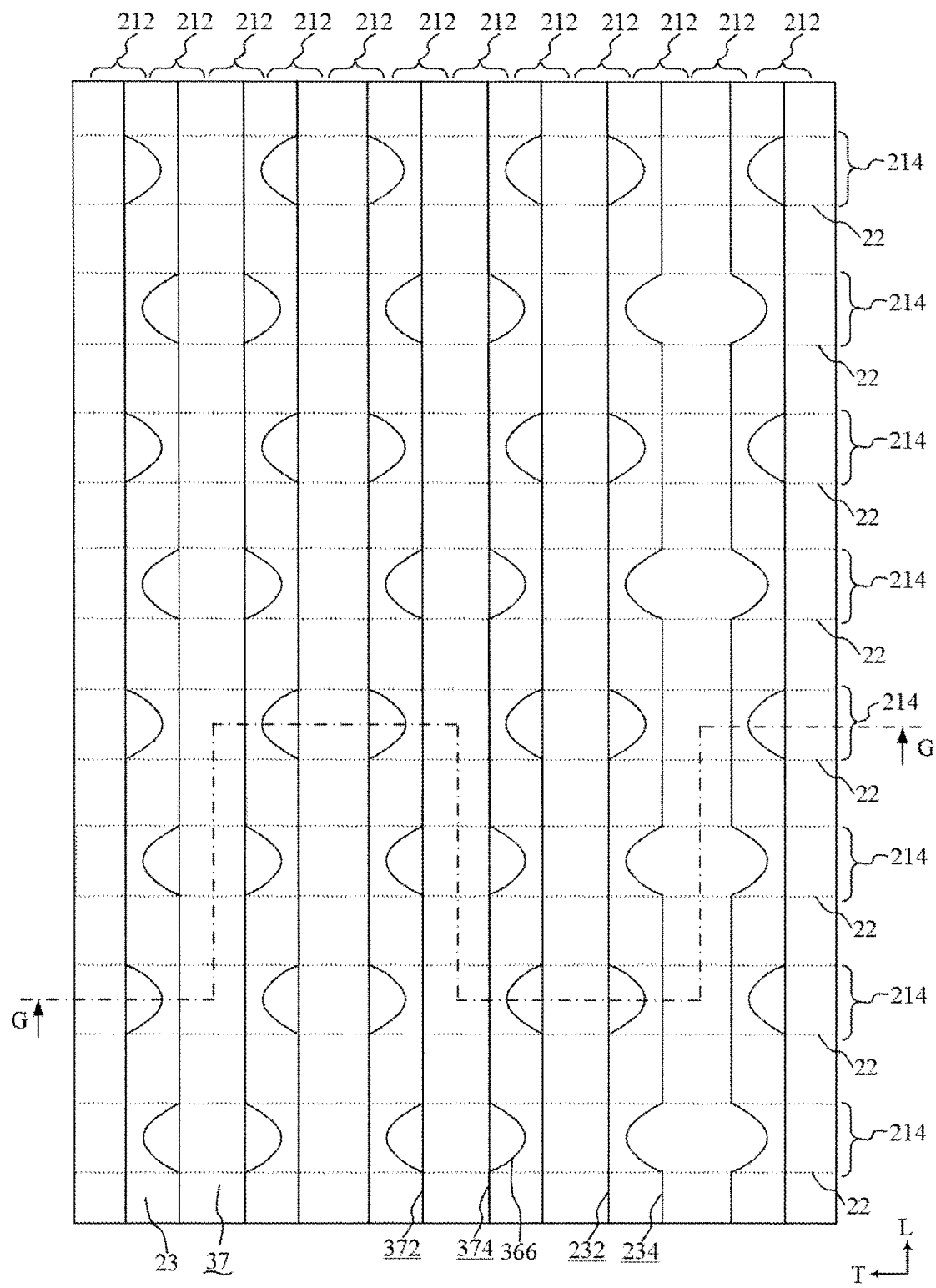
FIG. 15 is another top view of the semi-product of the DRAM device fabricated by the method according to the invention.
Figure 16:
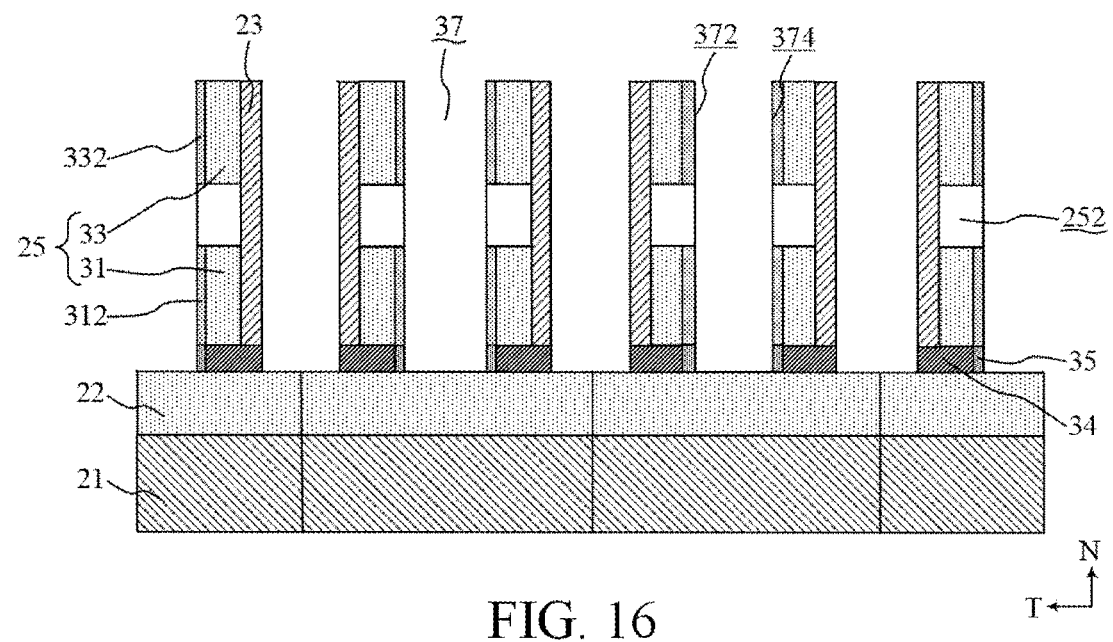
FIG. 16 is a cross-sectional schematic drawing of the semi-product of the DRAM device taken along the G-G line of FIG. 15.

Referring to FIG. 15 and FIG. 16, FIG. 15 is another top view of the semi-product of the DRAM device 2 fabricated by the method according to the invention. FIG. 16 is a cross-sectional schematic drawing of the semi-product of the DRAM device 2 taken along the G-G line of FIG. 15. As shown in FIG. 15 and FIG. 16, next, the method according to the invention is to form a plurality of first isolation stripes 23 which each is filled in one of the first trenches 36 such that a plurality of multi-layer stripes 25 of the first semiconductor layer 31, the first insulating layer 32 and the second semiconductor layer 33 and the first isolation stripes 23 are alternately arranged. Each first isolation stripe 23 has a respective first longitudinal edge 232 and a respective second longitudinal edge 234.

Also as shown in FIG. 15 and FIG. 16, then, the method according to the invention is to form a plurality of second trenches 37 parallel to the longitudinal direction L, where each second trench 37 is formed on a portion of one of the multi-layer stripes 25 and through the first semiconductor layer 31, the first insulating layer 32 and the second semiconductor layer 33, and has a respective third longitudinal side wall 372 and a respective fourth longitudinal side wall 374.

Also as shown in FIG. 15 and FIG. 16, subsequently, the method according to the invention is to partially dope the first semiconductor layer 31 and the second semiconductor layer 33 on the third longitudinal side wall 372 and the fourth longitudinal side wall 374 of each second trench 37 to form a plurality of first conductive portions 312 on the first semiconductor layer 31 and a plurality of second conductive portions 332 on the second semiconductor layer 33, where each first conductive portion 312 and each second conductive portion 332 correspond to one of the protrusions 366.

Also as shown in FIG. 15 and FIG. 16, afterward, the method according to the invention is to remove a plurality of retained portions of the first insulating layer 32 which each corresponds to one of the protrusions 366 such that a plurality of recesses 252 are formed on the third longitudinal side walls 372 and the fourth longitudinal side walls 374 of the second trenches 37, where the recesses 252 at one side of each first isolation stripe 23 and the recesses 252 at the other side of said one first isolation stripe 23 are staggeredly arranged. Each recess 252 corresponds to one of the columns 212 and one of the rows 214.

Figure 17:
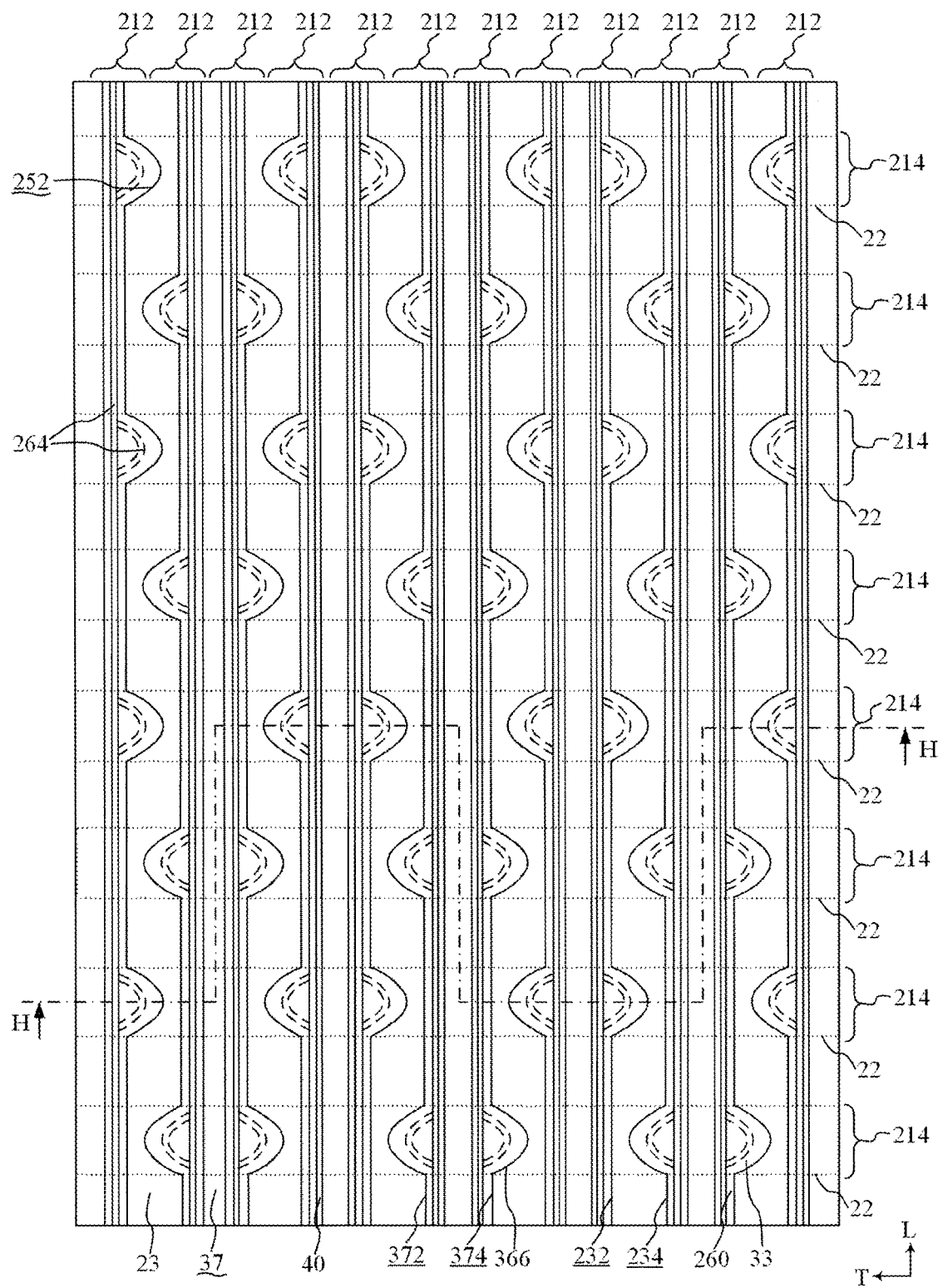
FIG. 17 is another top view of the semi-product of the DRAM device fabricated by the method according to the invention.
Figure 18:
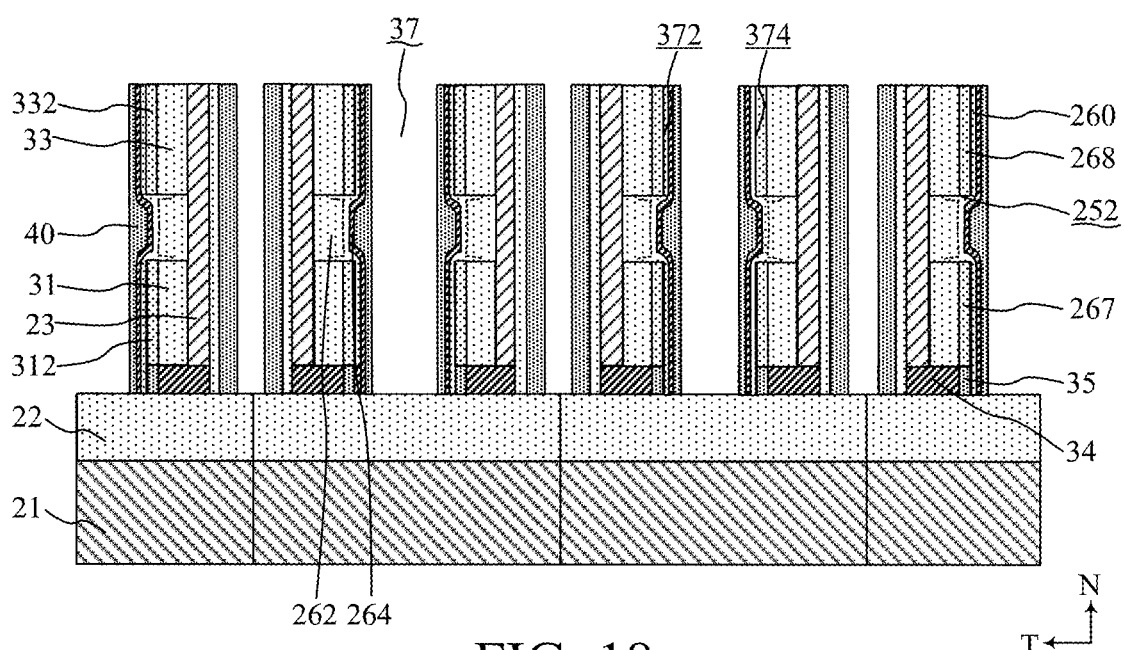
FIG. 18 is a cross-sectional schematic drawing of the semi-product of the DRAM device 2 taken along the H-H line of FIG. 17.

Referring to FIG. 17 and FIG. 18, FIG. 17 is another top view of the semi-product of the DRAM device 2 fabricated by the method according to the invention. FIG. 18 is a cross-sectional schematic drawing of the semi-product of the DRAM device 2 taken along the H-H line of FIG. 17. As shown in FIG. 17 and FIG. 18, next, the method according to the invention is to form a plurality of pillars 262 of a semiconductor material 260, where the pillars 262 of the semiconductor material 260 are arranged in the columns 212 and the rows 214. In order to easily manufacture, the semiconductor material 260 forming the pillars 262 can also overlay the first conductive portions 312 and the second conductive portions 332.

Referring to FIG. 4 and FIG. 5 again, each pillar 262 of the semiconductor material 260 is fitted in one of the recesses 252, and has a respective base side face 2620 parallel to the normal direction N, a respective tapered side face 2621 opposite to the base side face 2620, a respective first top face 2622 perpendicular to the normal direction N, a respective bottom face 2623 opposite to the first top face 2622, a respective front side face 2624 adjacent to the base side face 2620 and the tapered side face 2621, and a respective rear side face 2625 opposite to the front side face 2624. Each pillar 262 of the semiconductor material 260 also has a respective first elongated portion sandwiched among the first top face 2622, the base side face 2620, the front side face 2624 and the rear side face 2625 to form a respective source region SR, a respective second elongated portion sandwiched among the bottom face 2623, the base side face 2620, the front side face 2624 and the rear side face 2625 to form a respective drain region DR, a respective plate portion on the base side face 2620 and between the first elongated portion and the second elongated portion to form a respective channel region CR, and other portion of the pillar 262 of the semiconductor material 260 to form a respective body region. In practical, the semiconductor material 260 may be also overlaid on the third longitudinal side walls 372 and the fourth longitudinal side walls 374 of the second trenches 37.

Each of the first conductive portions 312 serves as one of a plurality of first sub-bit lines 267 which each correspond to one of the pillars 262 and connects between the drain region DR of the corresponding pillar 262 and the bit line 22 corresponding to said one pillar 262. Each of the second conductive portions 332 serves as one of a plurality of second sub-bit lines 268 which each corresponds to one of the pillars 262 and connects the source region SR of the corresponding pillar 262.

Also as shown FIG. 17 and FIG. 18, then, the method according to the invention is to form a plurality of gate oxide/dielectric layers 264 which each overlays the base side face 2620 of one of the pillars 262 of the semiconductor material 260. In order to easily manufacture, the gate oxide/dielectric layers 264 can also overlay the semiconductor material 260 overlaying the first conductive portions 312 and the second conductive portions 332.

Also as shown FIG. 17 and FIG. 18, subsequently, the method according to the invention is to form a plurality of conductor layers 40 which each overlays one of the third longitudinal side wall 372 and the fourth longitudinal side wall 374 of one of the second trenches 37. In practical, each of the conductor layers 40 may be also overlaid on one of the gate oxide/dielectric layers 264 and the semiconductor material 260.

Figure 19:
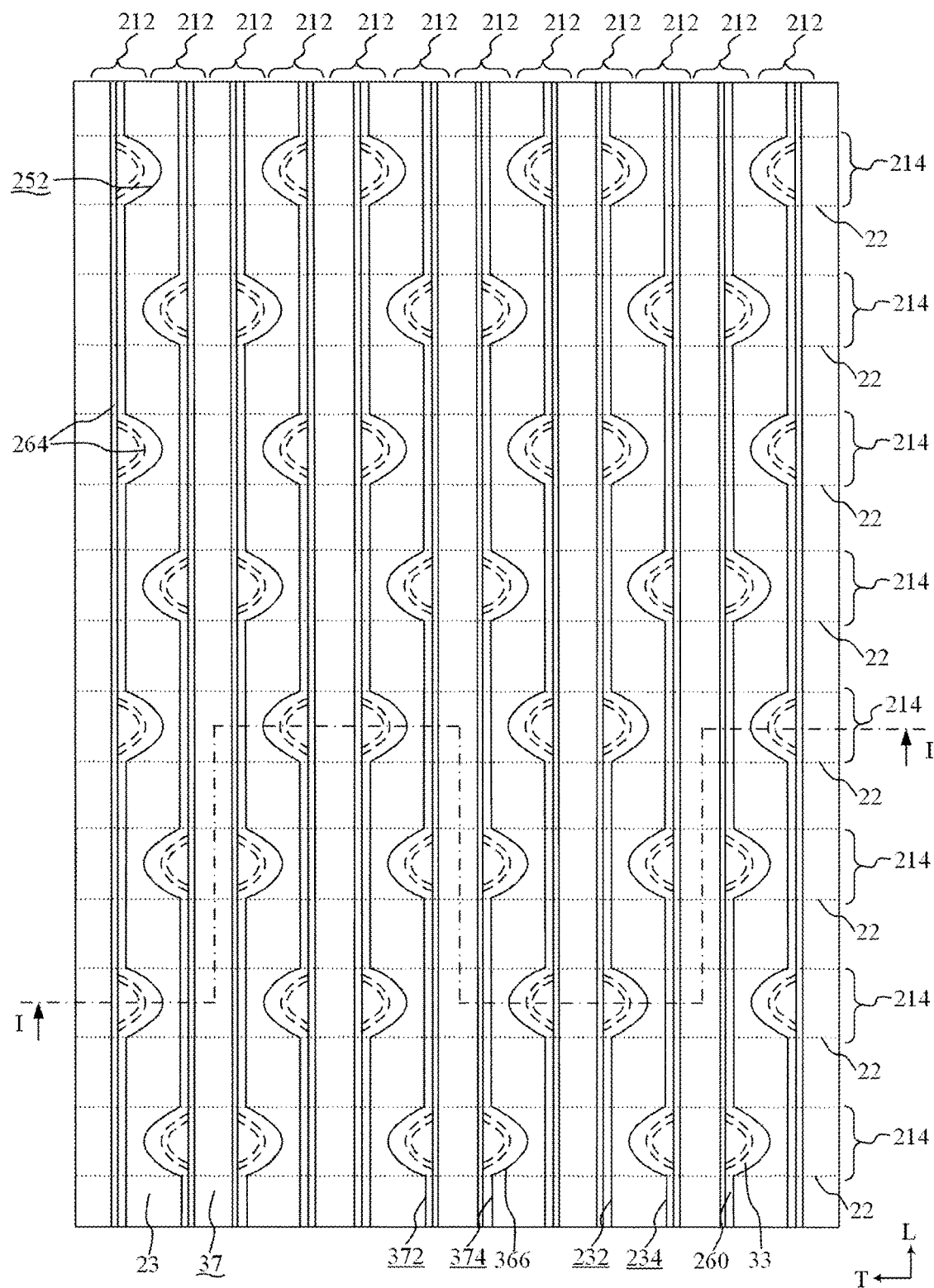
FIG. 19 is another top view of the semi-product of the DRAM device fabricated by the method according to the invention.
Figure 20:
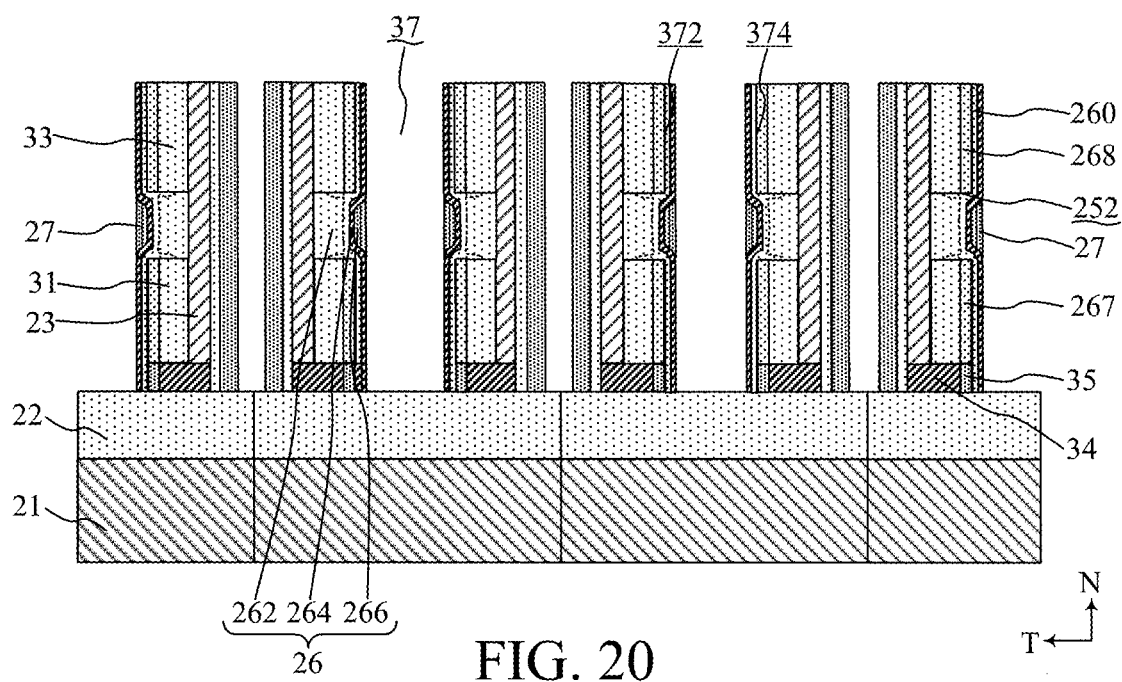
FIG. 20 is a cross-sectional schematic drawing of the semi-product of the DRAM device taken along the I-I line of FIG. 19.

Referring to FIG. 19 and FIG. 20, FIG. 19 is another top view of the semi-product of the DRAM device 2 fabricated by the method according to the invention. FIG. 20 is a cross-sectional schematic drawing of the semi-product of the DRAM device 2 taken along the I-I line of FIG. 19. As shown in FIG. 19 and FIG. 20, afterward, the method according to the invention is to partially etch the conductor layers 40 to form a plurality of gate conductors 266 and a plurality of word lines 27, where each gate conductor 266 overlays one of the gate oxide/dielectric layers 264, each word line 27 conductor corresponds to one of the columns 212 and connects the gate conductors 266 along the corresponding column 212. In order to increase the volume of the gate conductors 266 and the word lines 27, another semiconductor material (not shown in FIG. 18 and FIG. 20) can overlay the gate oxide/dielectric layers 264 overlaying the semiconductor material 260 overlaying the first conductive portions 312 and the second conductive portions 332 before the formation of the conductor layers 40.

It is noted that the portions of the conductive pads 39 within the second trenches 37 are removed to change the conductive pads 39 into a plurality of connection lines 35 which each corresponds to one of the first sub-bit lines 267 and connects between the corresponding first sub-bit line 267 and the corresponding bit line 22.

Figure 21:
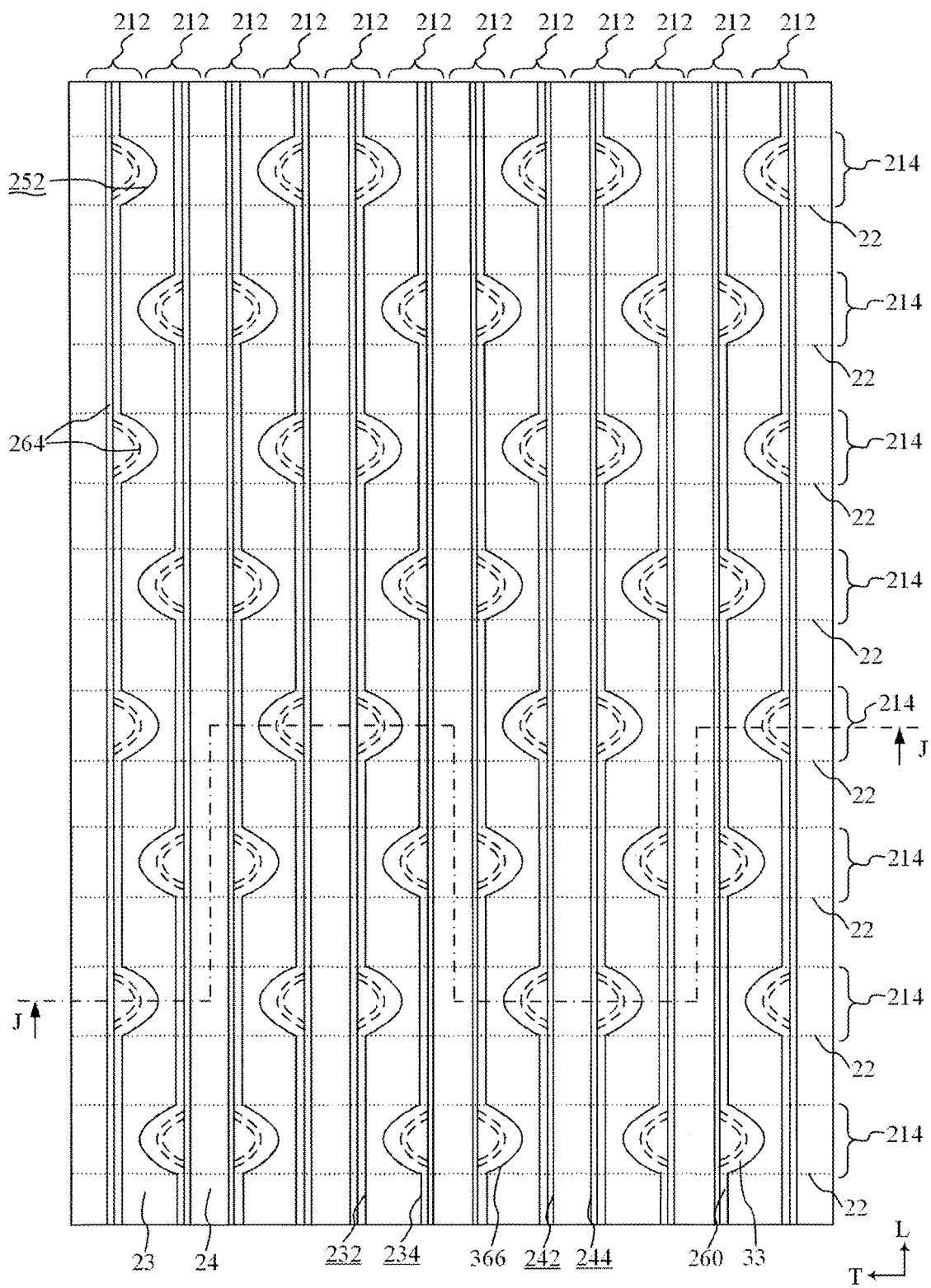
FIG. 21 is another top view of the semi-product of the DRAM device fabricated by the method according to the invention.
Figure 22:
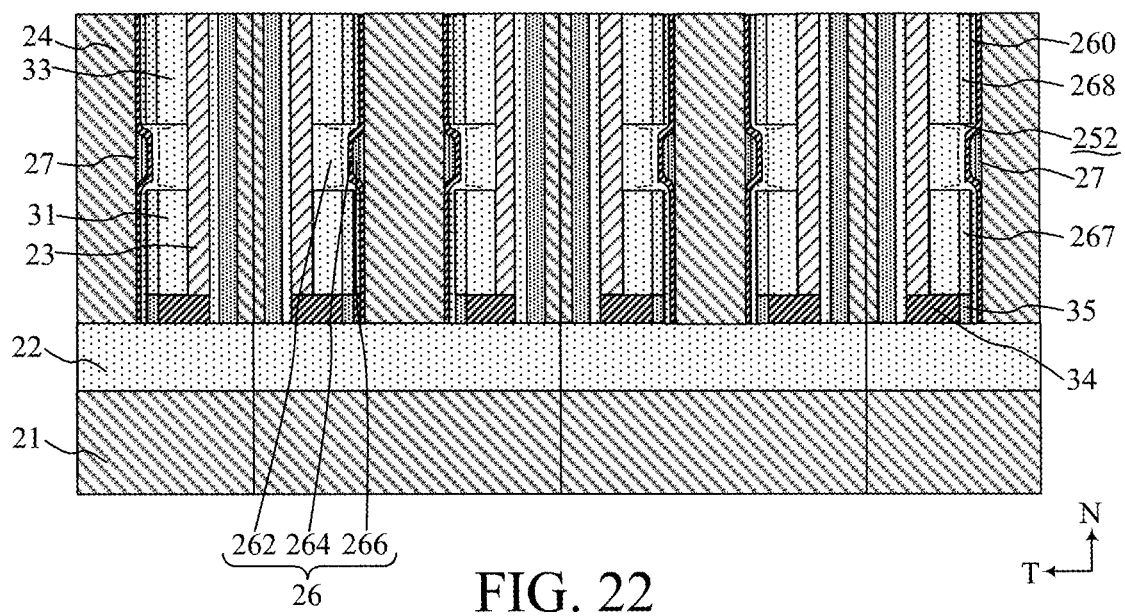
FIG. 22 is a cross-sectional schematic drawing of the semi-product of the DRAM device taken along the J-J line of FIG. 21.

Referring to FIG. 21 and FIG. 22, FIG. 21 is another top view of the semi-product of the DRAM device 2 fabricated by the method according to the invention. FIG. 22 is a cross-sectional schematic drawing of the semi-product of the DRAM device 2 taken along the J-J line of FIG. 21. As shown in FIG. 21 and FIG. 22, next, the method according to the invention is to form a plurality of second isolation stripes 24 which each is filled in one of the second trenches 37.

Referring to FIG. 7 and FIG. 8 again, then, the method according to the invention is to form a second insulating layer 28 on the second semiconductor layer 33, the first isolation stripes 23 and the second isolation stripes 24. Also as shown in FIG. 7 and FIG. 8, subsequently, the method according to the invention is to form a plurality of landing via contacts 29 which each corresponds to one of the second sub-bit lines 268 and is formed through the second insulating layer 28 to connect the corresponding second sub-bit line 268. Also as shown in FIG. 7 and FIG. 8, finally, the method according to the invention is to form a third insulating layer 38 on the second insulating layer 28 and the landing via contacts 29. Moreover, the method according to the invention is to form a plurality of capacitors 30 which each corresponds to one of the landing via contacts 29 and is formed through the third insulating layer 38 to connect the corresponding landing via contact 29. The capacitors 30 are separately isolated by the third insulating layer 38.

Figure 23:
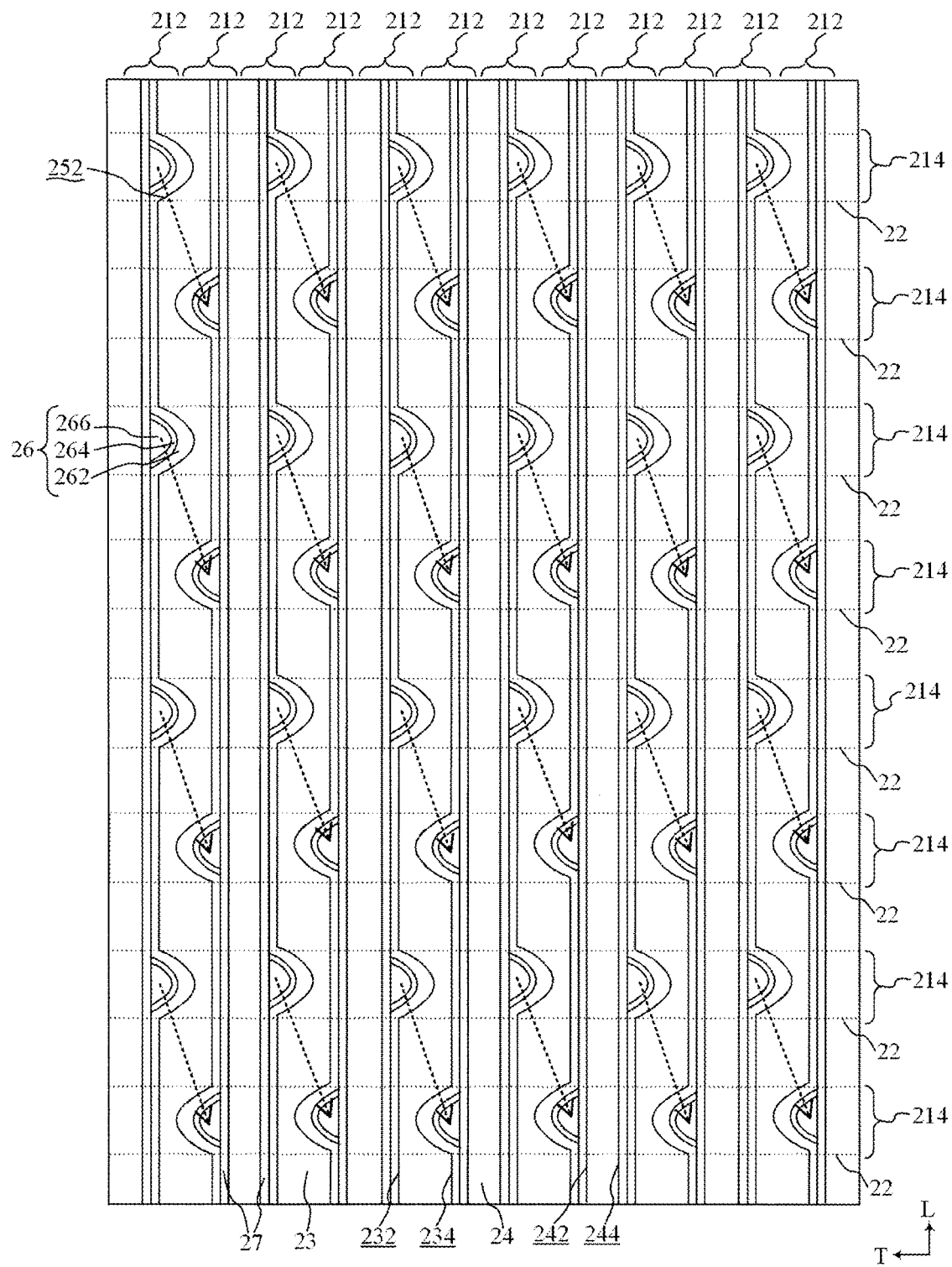
FIG. 23 is a top view of a modification of the DRAM device according to the invention and removing top structures or elements.
Figure 24:
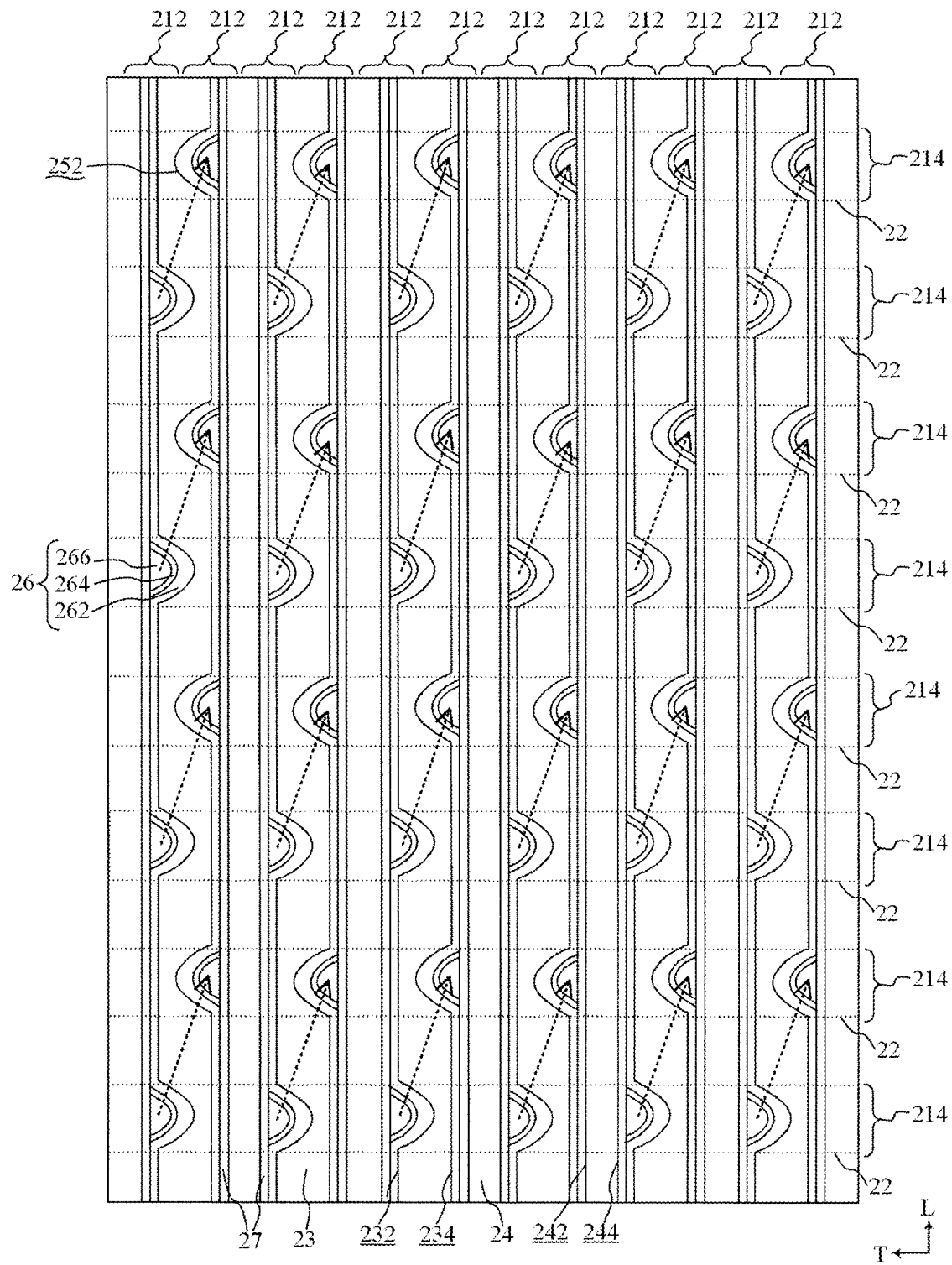
FIG. 24 is a top view of another modification of the DRAM device according to the invention and removing top structures or elements.
Figure 25:
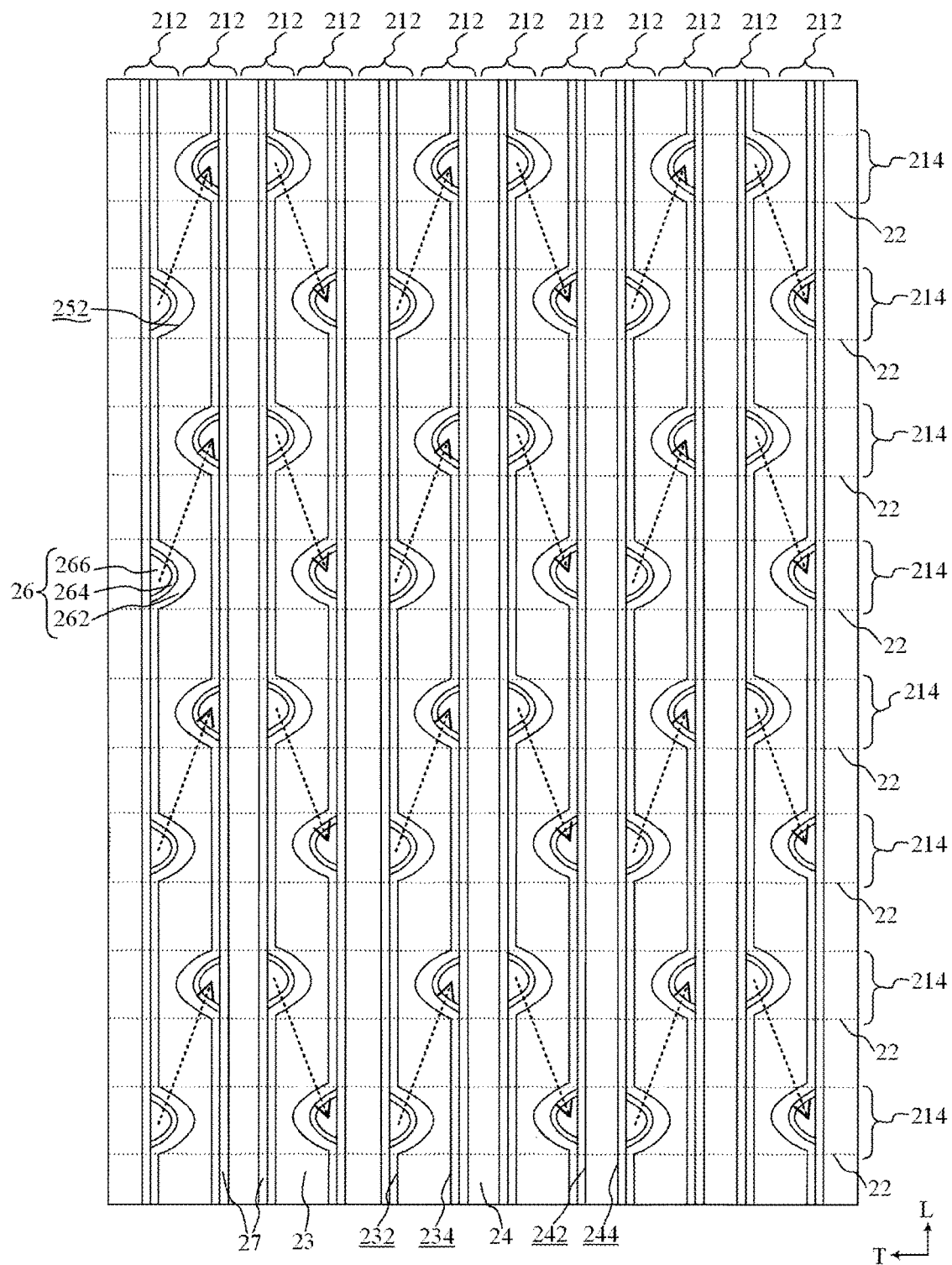
FIG. 25 is a top view of another modification of the DRAM device according to the invention and removing top structures or elements.

Referring to FIG. 23, FIG. 24 and FIG. 25, and referring to FIG. 6 again, FIG. 23 is a top view of a modification of the DRAM device 2 according to the invention and removing top structures or elements. FIG. 24 is a top view of another modification of the DRAM device 2 according to the invention and removing top structures or elements. FIG. 25 is a top view of another modification of the DRAM device 2 according to the invention and removing top structures or elements.

As shown in FIG. 6, FIG. 23, FIG. 24 and FIG. 25, the dashed arrows in those figures represent the directions of the transistors 26 arranged on the first longitudinal edge 232 of each of the first isolation stripes 23 mapping the transistors 26 on the second longitudinal edge 234 of said one first isolation stripe 23.

The directions of the dotted arrows indicated on the adjacent first isolation stripes 23 shown in FIG. 6, FIG. 23, FIG. 24 and FIG. 25 have different combinations. That is, for the DRAM device 2 according to the preferred embodiment of the invention, the symmetry of the transistors 26 arranged on the first longitudinal edges 232 and the second longitudinal edges 234 of the adjacent first isolation stripes 23 has various combinations as shown in FIG. 6, FIG. 23, FIG. 24, and FIG. 25. The DRAM devices 2 shown in FIG. 23, FIG. 24 and FIG. 25 also have all of the structural features of the DRAM device 2 shown in FIG. 6. The components and structures in FIGS. 23 to 25 identical to those shown in FIG. 6 are given the same numerical notations, and will be not described in detail herein.

With detailed description of the invention above, it is clear that the DRAM device according to the invention is constituted by a plurality of vertical current type FanFETs, and may have a cell size of less than $4F^2$.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A dynamic random access memory (DRAM) device, comprising:
   a semiconductor substrate, defining a longitudinal direction, a transverse direction, a normal direction, a plurality of columns in the longitudinal direction, and a plurality of rows in the transverse direction;
   a plurality of bit lines, formed on the semiconductor substrate, each bit line corresponding to one of the rows and extending along the corresponding row;
   a plurality of first isolation stripes, being formed on the bit lines and extending in the longitudinal direction, each first isolation stripe having a respective first longitudinal edge and a respective second longitudinal edge;
   a plurality of second isolation stripes, being formed on the bit lines and extending in the longitudinal direction, each second isolation stripe having a respective third longitudinal edge and a respective fourth longitudinal edge, the first isolation stripes and the second isolation stripes being alternatingly arranged;
   a plurality of multi-layer stripes, which each is constituted by a first semiconductor layer formed on the bit lines, a second semiconductor layer and a plurality of recesses formed between the first semiconductor layer and the second semiconductor layer, each multi-layer stripe corresponding to one of the first isolation stripes and one of the second isolation stripes and being located between the corresponding first isolation stripe and the corresponding second isolation stripe, wherein the plurality of recesses of each multi-layer stripe face the third longitudinal edge or the fourth longitudinal edge of the corresponding second isolation stripe, the recesses at one side of each first isolation stripe and the recesses at the other side of said one first isolation stripe are staggeredly arranged, each recess corresponds to one of the columns and one of the rows;
   a plurality of transistors, each transistor corresponding to one of the recesses and comprising a respective pillar of a semiconductor material, each pillar of the semiconductor material being fitted in the corresponding recess, extending in the transverse direction and having a respective base side face parallel to the normal direction, a respective tapered side face opposite to the base side face, a respective first top face perpendicular to the normal direction, a respective bottom face opposite to the first top face, a respective front side face adjacent to the base side face and the tapered side face, and a respective rear side face opposite to the front side face, a respective first elongated portion sandwiched among the first top face, the base side face, the front side face and the rear side face forming a respective source region, a respective second elongated portion sandwiched among the bottom face, the base side face, the front side face and the rear side face forming a respective drain region, a respective plate portion on the base side face and between the first elongated portion and the second elongated portion forming a respective channel region, and other portion of the pillar forming a respective body region, each transistor also comprising a respective gate oxide/dielectric layer overlaying the base side face of the corresponding pillar of the semiconductor material, a respective gate conductor overlaying the gate oxide/dielectric layer, a respective first sub-bit line being formed at the first semiconductor layer and connecting between the drain region and the bit line corresponding to said one transistor, and a respective second sub-bit line being formed at the second semiconductor layer and connecting the source region;
   a plurality of word lines, which each corresponds to one of the columns and connects the gate conductors arranged along the corresponding column by contacting the gate conductors;
   a second insulating layer, formed on the second semiconductor layer, the first isolation stripes and the second isolation stripes;
   a plurality of landing via contacts, which each corresponds to one of the second sub-bit lines and is formed through the second insulating layer to connect the corresponding second sub-bit line;
   a third insulating layer, formed one the second insulating layer and the landing via contacts; and
   a plurality of capacitors, which each corresponds to one of the landing via contacts and is formed through the third insulating layer to connect the corresponding landing via contact.

2. The DRAM device of claim 1, wherein each base side face is planar, convex or concave.

3. The DRAM device of claim 2, wherein in each transistor, a combination of the first top face of the pillar of the semiconductor material, a second top face of the gate oxide/dielectric layer and a third top face of the gate conductor exhibits one selected from the group consisting of a semi-ellipse, a semi-circle, a triangle, a finger-like shape and a trapezoid.

4. The DRAM device of claim 3, wherein a cell size of said DRAM device is equal to 3.5 times a square of a process feature size.

5. The DRAM device of claim 3, further comprising:
   a fourth insulating layer, formed to overlay the semiconductor substrate and the bit lines; and
   a plurality of connection lines which each corresponds to one of the first sub-bit lines and one of the bit lines and is formed through the fourth insulating layer to connect between the corresponding first sub-bit line and the corresponding bit line.

\* \* \* \* \*